United States Patent
Bazarsky et al.

(10) Patent No.: US 11,507,843 B2
(45) Date of Patent: Nov. 22, 2022

(54) SEPARATE STORAGE AND CONTROL OF STATIC AND DYNAMIC NEURAL NETWORK DATA WITHIN A NON-VOLATILE MEMORY ARRAY

(71) Applicant: Western Digital Technologies, Inc., San Jose, CA (US)

(72) Inventors: Alexander Bazarsky, Holon (IL); Ariel Navon, Revava (IL)

(73) Assignee: Western Digital Technologies, Inc., San Jose, CA (US)

( * ) Notice: Subject to any disclaimer, the term of this patent is extended or adjusted under 35 U.S.C. 154(b) by 332 days.

(21) Appl. No.: 16/834,515

(22) Filed: Mar. 30, 2020

(65) Prior Publication Data

US 2021/0304009 A1    Sep. 30, 2021

(51) Int. Cl.
| | |
|---|---|
| *G06N 3/08* | (2006.01) |
| *G06N 3/06* | (2006.01) |
| *G11C 16/34* | (2006.01) |
| *G11C 16/20* | (2006.01) |
| *G11C 16/26* | (2006.01) |

(Continued)

(52) U.S. Cl.
CPC ............. *G06N 3/084* (2013.01); *G06N 3/06* (2013.01); *G11C 16/20* (2013.01); *G11C 16/26* (2013.01); *G11C 16/3459* (2013.01); *H03M 13/015* (2013.01); *H03M 13/1545* (2013.01)

(58) Field of Classification Search
CPC .................................. G06N 3/06; G11C 16/26
USPC ....................................... 365/185.03; 706/25
See application file for complete search history.

(56) References Cited

U.S. PATENT DOCUMENTS

| | | |
|---|---|---|
| 6,545,907 B1 | 4/2003 | Lowrey et al. |
| 7,075,841 B2 | 7/2006 | Resta et al. |
| 7,274,586 B2 | 9/2007 | Choi et al. |

(Continued)

OTHER PUBLICATIONS

Kim et al.; "A 68 Parallel Row Access Neuromorphic Core with 22K Multi-Level Synapses Based on Logic-Compatible Embedded Flash Memory Technology;" 2018 IEEE International Electron Devices Meeting (IEDM); 2018; 4 pages <https://ieeexplore.ieee.org/document/8614599>.

(Continued)

*Primary Examiner* — Anthan Tran
(74) *Attorney, Agent, or Firm* — Loza & Loza, LLP; Gabriel Fitch

(57) ABSTRACT

Methods and apparatus are disclosed for managing the storage of static and dynamic neural network data within a non-volatile memory (NVM) die for use with deep neural networks (DNN). Some aspects relate to separate trim sets for separately configuring a static data NVM array for static input data and a dynamic data NVM array for dynamic synaptic weight data. For example, the static data NVM array may be configured via one trim set for data retention, whereas the dynamic data NVM array may be configured via another trim set for write performance. The trim sets may specify different configurations for error correction coding, write verification, and read threshold calibration, as well as different read/write voltage thresholds. In some examples, neural network regularization is provided within a DNN by setting trim parameters to encourage bit flips to avoid overfitting. Some examples relate to managing non-DNN data, such as stochastic gradient data.

22 Claims, 13 Drawing Sheets

(51) Int. Cl.
*H03M 13/15* (2006.01)
*H03M 13/01* (2006.01)

(56) References Cited

U.S. PATENT DOCUMENTS

| | | | |
|---|---|---|---|
| 7,463,520 | B2 | 12/2008 | Aritome |
| 7,580,287 | B2 | 8/2009 | Aritome |
| 7,983,069 | B2 | 7/2011 | Hsu et al. |
| 8,199,566 | B1 | 6/2012 | Fackenthal et al. |
| 9,430,735 | B1 | 8/2016 | Vali et al. |
| 10,090,044 | B2 | 10/2018 | Achtenberg et al. |
| 10,430,328 | B2 | 10/2019 | Sela et al. |
| 11,360,818 | B2 * | 6/2022 | Huang ................ G06F 9/5044 |
| 2010/0027329 | A1 | 2/2010 | Lee et al. |
| 2012/0311262 | A1 | 12/2012 | Franceschini et al. |
| 2013/0013860 | A1 | 1/2013 | Franceschini et al. |
| 2016/0077968 | A1 | 3/2016 | Sela et al. |
| 2016/0099057 | A1 | 4/2016 | Dusija et al. |
| 2017/0068451 | A1 | 3/2017 | Kenan et al. |
| 2019/0073259 | A1 | 3/2019 | Qin et al. |
| 2021/0357739 | A1 * | 11/2021 | Ramesh ................ G06N 3/08 |

OTHER PUBLICATIONS

Liang et al.; "Cognitive SSD: A Deep Learning Engine for In-Storage Data Retrieval;" 2019 USENIX Annual Technical Conference; Jul. 2019; 17 pages <https://www.usenix.org/conference/atc19/presentation/liang>.

Srivastava et al.; "Dropout: A Simple Way to Prevent Neural Networks from Overfitting;" Journal of Machine Learning Research 15; 2014; 30 pages <https://www.cs.toronto.edu/~hinton/absps/JMLRdropout.pdf>.

Nielsen, Michael; "Neural Networks and Deep Learning, Chapter 2: How the backpropagation algorithm works;" 2015; 27 pages <http://neuralnetworksanddeeplearning.com/chap2.html>.

* cited by examiner

| Static Data Memory Trim Set | |
|---|---|
| Parameter | Value |
| Program (write) voltage setting | |
| Program (write) pulse width | |
| Program (write) Threshold | |
| Read Threshold | |
| ECC ON/OFF | |
| Number of ECC bits | |
| Write Verification ON/OFF | |
| No. of Write Verification Pulses | |
| Read Calibration Settings | |

216

| Dynamic Data Memory Trim Set | |
|---|---|
| Parameter | Value |
| Program (write) voltage setting | |
| Program (write) pulse width | |
| Program (write) Threshold | |
| Read Threshold | |
| ECC ON/OFF | |
| Number of ECC bits | |
| Write Verification ON/OFF | |
| No. of Write Verification Pulses | |
| Read Calibration Settings | |

217

| Regular Data Memory Trim Set | |
|---|---|
| Parameter | Value |
| Program (write) voltage setting | |
| Program (write) pulse width | |
| Program (write) Threshold | |
| Read Threshold | |
| ECC ON/OFF | |
| Number of ECC bits | |
| Write Verification ON/OFF | |
| No. of Write Verification Pulses | |
| Read Calibration Settings | |

SEPARATE STORAGE AND CONTROL OF STATIC AND DYNAMIC NEURAL NETWORK DATA WITHIN A NON-VOLATILE MEMORY ARRAY

FIELD

The disclosure relates, in some embodiments, to non-volatile memory (NVM) arrays and to data storage controllers for use therewith. More specifically, but not exclusively, the disclosure relates to methods and apparatus for controlling neural network data storage within an NVM die under the control of a data storage controller.

INTRODUCTION

Deep learning (which also may be referred to as deep structured learning or hierarchical learning) relates to machine learning methods based on learning data representations or architectures, such as deep neural networks (DNNs), rather than to task-specific procedures or algorithms. Deep learning is applied to such fields as speech recognition, computer vision, and self-driving vehicles. Deep learning may be accomplished by, or facilitated by, deep learning accelerators (DLAs), e.g., microprocessor devices designed to accelerate the generation of useful neural networks to implement deep learning. Deep learning is an example of a type of multidimensional computation procedure, which may employ stochastic gradient-based optimization procedures to identify minima or maxima in a multidimensional space. Other examples include expectation-maximization procedures, regularized regression procedures, and stochastic gradient descent procedures.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides a memory die that includes non-volatile memory (NVM) elements and processing circuitry configured to: store a first set data for a multidimensional computation procedure in a first set of the NVM elements using a first set of NVM access parameters selected for use with the first set of data; generate a second set of data from the first set of data using the multidimensional computation procedure, wherein the second set of data has a rate of change that is greater than a rate of change of the first set of data; and store the second set of data in a second set of the NVM elements using a second set of NVM access parameters selected for use with the second set of data.

Another embodiment of the disclosure provides a method for use with a memory die including NVM elements. The method includes: storing a first set of data for a multidimensional computation procedure in a first set of NVM elements using a first set of trim parameters selected for use with the first set of data; generating a second set of data from the first set of data using the multidimensional computation procedure, wherein the second set of data has a rate of change that is greater than a rate of change of the first set of data; and storing the second set of data in a second set of NVM elements using a second set of trim parameters selected for use with the second set of data.

Yet another embodiment of the disclosure provides an apparatus including: means, formed on a memory die having an NVM array, for storing static data for a multidimensional computation procedure in a first set of NVM elements using a first set of NVM access parameters selected for use with static data; means, formed on the memory die, for generating dynamic data from the static data using the multidimensional computation procedure; and means, formed on the memory die, for storing the dynamic data in a second set of NVM elements using a second set of NVM access parameters selected for use with the dynamic data.

BRIEF DESCRIPTION OF THE DRAWINGS

FIG. 3 illustrates exemplary trim sets for static memory data, dynamic memory data and regular (non-neural network) memory data.

DETAILED DESCRIPTION

Figure 1:
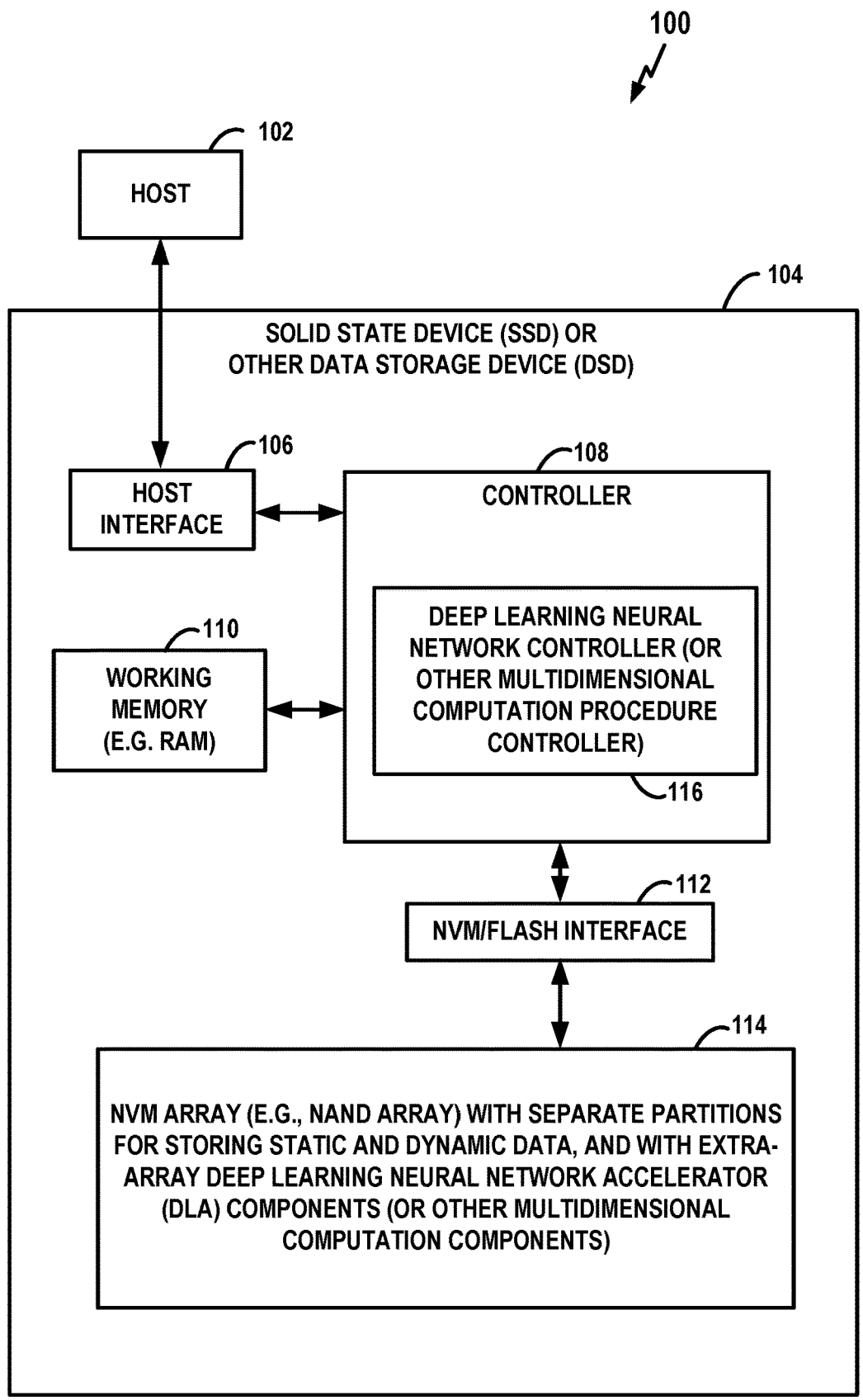
FIG. 1 shows a schematic block diagram configuration for an exemplary solid state device (SSD) having one or more non-volatile memory (NVM) array dies, where the NVM dies have separate partitions for storing static and dynamic data, and have extra-array DLA components (or other multidimensional computation components).

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (DSD), e.g. a solid state device (SSD), and in particular to solid-state memory storage devices such as those that use NAND flash memory, herein "NANDs". (A NAND is a type of non-volatile storage technology that does not require power to retain data. It exploits negative-AND, i.e. NAND, logic.) For the sake of brevity, an SSD having one or more NAND dies will be used as a non-limiting example of a DSD below in the description of various embodiments. It is understood that at least some aspects described herein may be applicable to other forms of data storage devices as well. For example, at least some aspects described herein may be applicable to phase-change memory (PCM) arrays, magneto-resistive random access memory (MRAM) arrays and resistive random access memory (ReRAM) arrays. In addition, the various embodiments may be used in various machine learning devices which may include some combination of processing elements and memory/data storage elements, including the NVM arrays constructed and/or configured in accordance with the described embodiments.

As noted above, deep learning may be accomplished by, or facilitated by, deep learning accelerators (DLAs), e.g., microprocessor devices designed to accelerate the generation of deep neural networks (DNNs) to implement deep learning. These networks may also be referred to as learning networks. Herein, methods and apparatus are disclosed for controlling or managing the storage of neural network data for DNNs or DLAs (or other multidimensional computation procedures) within an NVM die or other memory die. In particular, methods and apparatus are disclosed for separately controlling or managing the storage of static neural network data (such as input neural network data) and dynamic neural network data (such as synaptic weights) within an NVM array. For example, trim parameters for separate portions or partitions of an NVM array may be set differently depending on whether the partitions store static neural network data or dynamic neural network data, where the parameters define how read and write accesses to the static neural network data and dynamic neural network data are to be performed. For instance, trim parameters controlling error correction codes (ECC), write verification, and read threshold calibration may be set differently depending upon whether the data is static or dynamic. Still further, trim parameters may be controlled to prevent or remedy overfitting to regularize the DNN by allowing or encouraging bit flips in the synaptic weights and/or data samples to escape from local minima and converge to global minima or maxima in the DNN.

The NVM die or other memory die may be configured to implement neural network processing components, such as DLA backpropagation components, on or in the NVM die itself using under-the-array or other extra-array circuit components. Examples that incorporate DLA components in an NVM die may involve NAND-based arrays and may be referred to herein as DLA NAND arrays or DLA NAND architectures.

Note that a DNN is an example of an artificial neural network that has multiple layers between input and output layers. A DNN operates to determine a mathematical computation or manipulation to convert the input into the output, which might be a linear or non-linear computation. For example, the DNN may work through its layers by calculating a probability of each output. Each mathematical manipulation may be considered a layer. Networks that have many layers are referred to as having "deep" layers, hence the term DNN. In one particular example, the DNN might be configured to identify a person within an input image by processing the bits of the input image to yield identify the person, i.e. the output of the DNN is a value that identifies the particular person.

DNNs are often configured as feedforward networks, in which data flows from an input layer to an output layer in one direction. Initially, the DNN may generate a map of virtual "neurons" and assign initial numerical values or "weights" to connections between the neurons. The weights and inputs are multiplied to return output values between, e.g., 0 and 1. The weights may be adjusted in an attempt to improve the accuracy by which the network relates its input to a known output (to, for example, correctly identified an input image).

In one aspect of a DLA of a DNN, a feedforward computation for a single neuron activation in DNN is given by Equation 1 below, where multiply-accumulate (MAC) operations using synaptic weights are summed and then an activation function is calculated, which is often a maximum function (such as a rectifier linear activation function computed by a rectifier linear unit (RLU or ReLU)) or a sigmoid function. That is, in some examples, the feedforward computation involves a sum over weights (w or ω) multiplied by input values (a, z) to each neuron in the network plus a bias value (b), the result of which is then applied to a sigmoid activation function (σ) to yield the next value in the network.

$$a_j^l = \sigma\left(\sum_k w_{jk}^l a_k^{l-1} + b_j^l\right) \quad (1)$$

In Equation 1, $w_{jk}^l$, denotes the weight for a connection from a $k^{th}$ neuron (or node) of the neural network) in an $(l-1)^{th}$ layer of the neural network to a $j^{th}$ neuron in an $l^{th}$ layer. The term $b_j^l$ denotes a bias of the $j^{th}$ neuron in the $l^{th}$ layer and $a_j^l$ denotes the activation of the $j^{th}$ neuron in the $l^{th}$ layer. Thus, the activation $a_j^l$ of the $j^{th}$ neuron in the $l^{th}$ layer is related to the activations in the $(l-1)^{th}$ layer. Note also that in Equation 1 the sum is over all neurons k in the $(l-1)^{th}$ layer. That is, for each layer, the weight w of each of the k neurons in the layer is multiplied by a corresponding activation value for the neuron, the values of this intermediate computation are summed together. This is the aforementioned MAC operation which multiplies individual w and a values and then accumulates (i.e. sums) the results. The appropriate bias value b is then added to the output of the MAC and result is applied to the sigmoid activation function (σ) to obtain the next activation value a. Note also that the zeroth layer of the neural network may be referred to as the input layer, the first layer of the neural network may be referred to as the first hidden layer, and the final layer of the neural network may be referred to as the output layer.

DLA learning schemes may be based on solving backpropagation equations to update the network weights (w or ω). Exemplary backpropagation equations are based on weighted sums using calculated δ terms (in the equations below in a matrix and vector form) for the output and so-called hidden layer neurons in the DNN (i.e. the intermediate layers between the input layer and the output layer) and wherein training values are employed.

Briefly, a cost function C may be defined:

$$C = \frac{1}{2n} \sum_x \|y(x) - a^L(x)\|^2 \qquad (2)$$

where n is a total number of training examples x, the sum is over individual training examples, x; y=y(x) is a corresponding desired output (e.g. a known output); L denotes the number of layers in the network; and $a^L=a^L(x)$ is a vector of activations output from the neural network when x is input.

Error values δ may be defined based on the cost function and a weighted input values z:

$$\delta_j^l \equiv \frac{\partial C}{\partial z_j^l}. \qquad (3)$$

where $\delta_j^l$ is the error of a neuron j in a layer l and where $z_j^l$ is a weighted input for the neuron j in the layer l. It is noted that the error $\delta_j^l$ is equal to a rate of change of C relative to the bias value b for the jth neuron of the lth layer, e.g.:

$$\frac{\partial C}{\partial b} = \delta \qquad (4)$$

where δ is evaluated at the same neuron as the bias b.

Four main backpropagation equations may then be defined:

$$\delta^L = \nabla_a C \odot \sigma'(z^L). \qquad (5)$$

$$\delta^l = ((w^{l+1})^T \delta^{l+1}) \odot \sigma'(z^l) \qquad (6)$$

$$\frac{\partial C}{\partial b_j^l} = \delta_j^l \qquad (7)$$

$$\frac{\partial C}{\partial w_{jk}^l} = a_k^{l-1} \delta_j^l \qquad (8)$$

As these are standard backpropagation equations, they will not be described in detail herein, other than to note that the T of Eq. (6) indicates a matrix transpose, the σ' of Eq. (6) denotes a derivative of the sigmoid function σ, and the symbol ⊙ denotes a Hadamard product, i.e. an elementwise product of two vectors.

Based on these equations (or, in some cases, other standard backpropagation equations), the synaptic weights (w or ω) of the DNN may be updated based on a desired output of the neural network y=y(x) provided by the user, which may be input for training purposes and used in conjunction with the existing bias values b, weights (w or ω) and activation values a and z values already stored. For example, the desired outputs, y(x), sometimes called in the literature "learning labels" or "learning targets" of a supervised learning scheme may be provided by the user/host device to the DLA NAND. DNN backpropagation equations have fixed inputs (z), which are input to backpropagation Equation 6, that are not changed and can be stored in static memory and dynamic values (C and δ and ω (or w) that are adjusted or computed temporarily within Equations 5-7 and would benefit from storage in dynamic memory.

Herein, the term "static data memory" refers to memory that has been configured for, or optimized for, storing data that is not updated at all or updated only rarely (e.g. z values). Herein, the term "dynamic data memory" refers to memory that has been configured for, or optimized for, storing data that is updated frequently (e.g. C, δ and ω (or w) values). In some examples, static data is data that does not change at all during the multidimensional computation procedure and dynamic data is data that changes during the multidimensional computation procedure. In other examples, static data may be distinguished from dynamic data based on how often or how significantly the data changes as quantified by some criteria, metric or threshold values. For instance, static data may be defined as data that changes slower than a first threshold rate during the multidimensional computation procedure and dynamic data may be defined as data that changes faster than a second (different) threshold rate during the multidimensional computation procedure. The first threshold rate may be preprogrammed or otherwise set to a value representative of rare or infrequent changes to the data, whereas the second threshold rate may be preprogrammed or otherwise set to a value representative of frequent changes to data. The particular thresholds, metrics or other criteria used to distinguish static data from dynamic data may depend on the particular multidimensional computation procedure and other factors.

In various aspects discussed herein, the static data memory may be configured to achieve high data retention and write endurance (as compared to the dynamic data memory) via appropriate selection of NVM trim settings or the like, such as by controlling read threshold calibration. The dynamic data memory may be configured to achieve high read and write performance (as compared to the static data memory) via appropriate selection of trim settings or the like, such as by disabling ECC and write verification. In examples herein, both static data memory and dynamic data memory are portions of an NVM array. Hence, static data memory, as the term is used herein, should not be confused with static random access memory (SRAM) and dynamic data memory, as the term is used herein, should not be confused with dynamic RAM (DRAM). Note also that both the static data memory and the dynamic data memory can be configured differently from other portions of the NVM array that store a mixture of static and dynamic data, such as portions of memory that store non-DNN data, e.g. user data.

The trim settings may be grouped within "trim sets" that may include one or more trim parameters or values, such as a program voltage, a step-up voltage, and/or a program pulse width. Each trim set may be associated with a corresponding portion of semiconductor memory. Each portion of memory may be a page, a block, a column, or any other suitable division of the semiconductor memory. Insofar as write verification is concerned, the trim parameters controlling write verification can be set, adjusted or controlled based on whether the data is static or dynamic. In particular, write verification may be disabled (or fewer write verification pulses can be used) during the storage of dynamic neural network data as opposed to static neural network data. Disabling write verification for dynamic neural network data enhances write performance, which is important for data that may need to be re-written frequently, because performing write verification slows down the overall write process. Similarly, ECC may be disabled (or fewer ECC bits can be used) during the storage of dynamic neural network data. Disabling ECC for dynamic neural network data enhances read performance, which is likewise important for data that may need to be re-read frequently, because performing ECC slows down the overall read process. In some examples, ECC is disabled or reduced for both static neural network data and dynamic neural network data. This allows a greater number of bit flips (i.e. a higher bit error rate (BER) within both the input data (e.g. z) and within the dynamic data (e.g. C, δ and ω), which can be beneficial for regularizing the neural network to avoiding overfitting of the data. Still further, reducing or eliminating ECC bits saves memory space while reducing power consumption.

Insofar as read threshold calibration is concerned, the trim parameters controlling read threshold calibration can be set, adjusted or controlled based on whether the data is static or dynamic. Since dynamic DNN data in the dynamic data NVM array is updated very often, read threshold calibration can be performed less often than with regular (non-DNN data), as there is often little or no change in the physical characteristics of the NVM from one read/write to another. Since static DNN data is either not updated at all or updated only rarely, read threshold calibration can be performed far less often than with dynamic DNN data or non-DNN data but is still performed to ensure the data can be read later despite changes in device temperature or other physical characteristics. Accordingly, the trim settings for read threshold calibration can be set for the static data NVM array to ensure that read threshold calibration is performed occasionally (e.g. once per day or once per week), whereas read threshold calibration may be set to be performed once every few minutes for the dynamic data NVM array. The frequency of read threshold calibration can be set to yet another rate for non-DNN data.

Furthermore, other trim parameters such as read and write voltage threshold levels, garbage collection control parameters, etc. may be set, adjusted or controlled based on the data type (e.g. static vs. dynamic). In one example, voltage threshold levels are set to ensure (or cause) some threshold number of bit flips to avoid DNN overfitting. Still further, rather than configuring only three different memory types (static data memory, dynamic data memory, and regular data memory), additional subdivisions of the NVM array may be configured, such as two or more portions of dynamic data memory (e.g. dynamic data memory #1, dynamic data memory #2, etc.) that have different trim settings to account for different read/write frequencies. For example, one portion of dynamic data memory (for storing the most frequently updated DNN values) may have trim settings configured to disable both ECC and write verification, whereas another portion of dynamic data memory (for storing less frequently updated DNN) values may have trim settings configured to apply ECC and write verification while using relatively few ECC bits and relatively few write verification pulses.

Thus, in some examples described herein, a high performance DNN system is disclosed that includes flash NAND dies with under-the-array circuitry to perform neural network computations based on neural network data stored in NAND data blocks, where the static data (e.g. z) and the dynamic data (e.g. C and 6 and w) are managed separately by under-the-array circuitry in the NAND dies or by the data storage controller.

Although described primarily with reference to DNN examples, many features described herein can be applied to the storage of data for other types of processing systems, such as expectation-maximizations systems, regularized regression, stochastic gradient descents, etc. For example, the separate management of static and dynamic data and the elimination or reduction of ECC may be beneficial for other multidimensional minima or maxima optimization procedures. For instance, implementing stochastic gradient-based optimization algorithms on an NVM die may use an intermediate computation "work-sheet" at the memory level, during which the typical data retention duration is very short. The features described herein may thus allow enhanced acceleration of read/programming durations for such applications. Still further, the features described herein utilize a NVM die as a short-duration, fast-response working-area for DNN or other optimization algorithms implemented in the NVM die level. These features contribute to enabling implementation of large-scale, non-urgent calculations in the NVM die, while reducing the need to rely on external bus lines to the host and the host resources (or other devices external to the NVM die, such as DRAM) for frequent transference of large quantities of DNN data (since DNN processing may be performed on-chip with reduced bus usage).

Exemplary Devices, Systems, Procedures and Apparatus

FIG. 1 is a block diagram of a system 100 including an exemplary SSD or DSD having an NVM array with separate memory partitions (or separate arrays, portions, blocks, wordlines, etc.) for separately storing static and dynamic neural network data in accordance with aspects of the disclosure. The NVM array also has deep learning DLA components (e.g. under-the-array, next-to-the-array circuit or other extra-array components) or other multidimensional computation components. The system 100 includes a host 102 and a SSD 104 (or other DSD, but for simplicity referred to as SSD below) coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples. Additionally, or alternatively, the host 102 may be a system or device having a need for neural network processing, such as speech recognition, computer vision, and self-driving vehicles. For example, the host 102 may be a component of a self-driving system of a vehicle or a component of an Internet-of-Things (IoT) device.

The SSD 104 includes a host interface 106, a controller 108, a working memory 110 (such as RAM or other volatile memory), an NVM interface 112 (which may be referred to as a flash interface), and an NVM array 114, such as one or more NAND dies. The NVM array 114 includes separate partitions for storing static and dynamic data and has extra-array DLA components (or other multidimensional computation components). The host interface 106 is coupled to the controller 108 and facilitates communication between the host 102 and the controller 108. The controller 108 is coupled to the memory 110 as well as to the NVM array 114 via the NVM interface 112. The host interface 106 may be any suitable communication interface, such as a Non-Volatile Memory Express (NVMe) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

The controller 108 controls operation of the SSD 104. In various aspects, the controller 108 receives commands from the host 102 through the host interface 106 and performs the commands to transfer data between the host 102 and the NVM 114. Furthermore, the controller 108 may manage reading from and writing to memory 110 for performing the various functions effected by the controller and to maintain and manage cached information stored in memory 110. The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The working memory 110 may be any suitable memory, computing device, or system capable of storing data. For example, the memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the memory 110, or a portion thereof, to store data during the transfer of data between the host 102 and the NVM 114. For example, the working memory 110 or a portion of the memory 110 may be a cache memory. The NVM 114 receives data from the controller 108 via the NVM interface 112 and stores the data. The NVM 114 may be any suitable type of non-volatile memory, such as a NAND-type flash memory or the like. In some embodiments, working memory 110 may be replaced by a non-volatile memory such as MRAM, PCM, ReRAM, etc. to serve as a working memory for the overall device. In the example of FIG. 1, the controller 108 may include hardware, firmware, software, or any combinations thereof that provide a deep learning neural network controller 116 (or other multidimensional computation procedure controller) for use with the NVM array 114.

Although FIG. 1 shows an example SSD and an SSD is generally used as an illustrative example in the description throughout, the various disclosed embodiments are not necessarily limited to an SSD application/implementation. As an example, the disclosed NVM die(s) and associated processing components can be implemented as part of a package that includes other processing circuitry and/or components. For example, a processor may include, or otherwise be coupled with, embedded NVM and associated circuitry and/or components for deep learning that are described herein. The processor could, as one example, off-load certain machine learning tasks to the NVM and associated circuitry and/or components. As another example, the controller 108 may be a controller in another type of device and still include the neural network controller 116 and perform some or all of the functions described herein.

Figure 2:
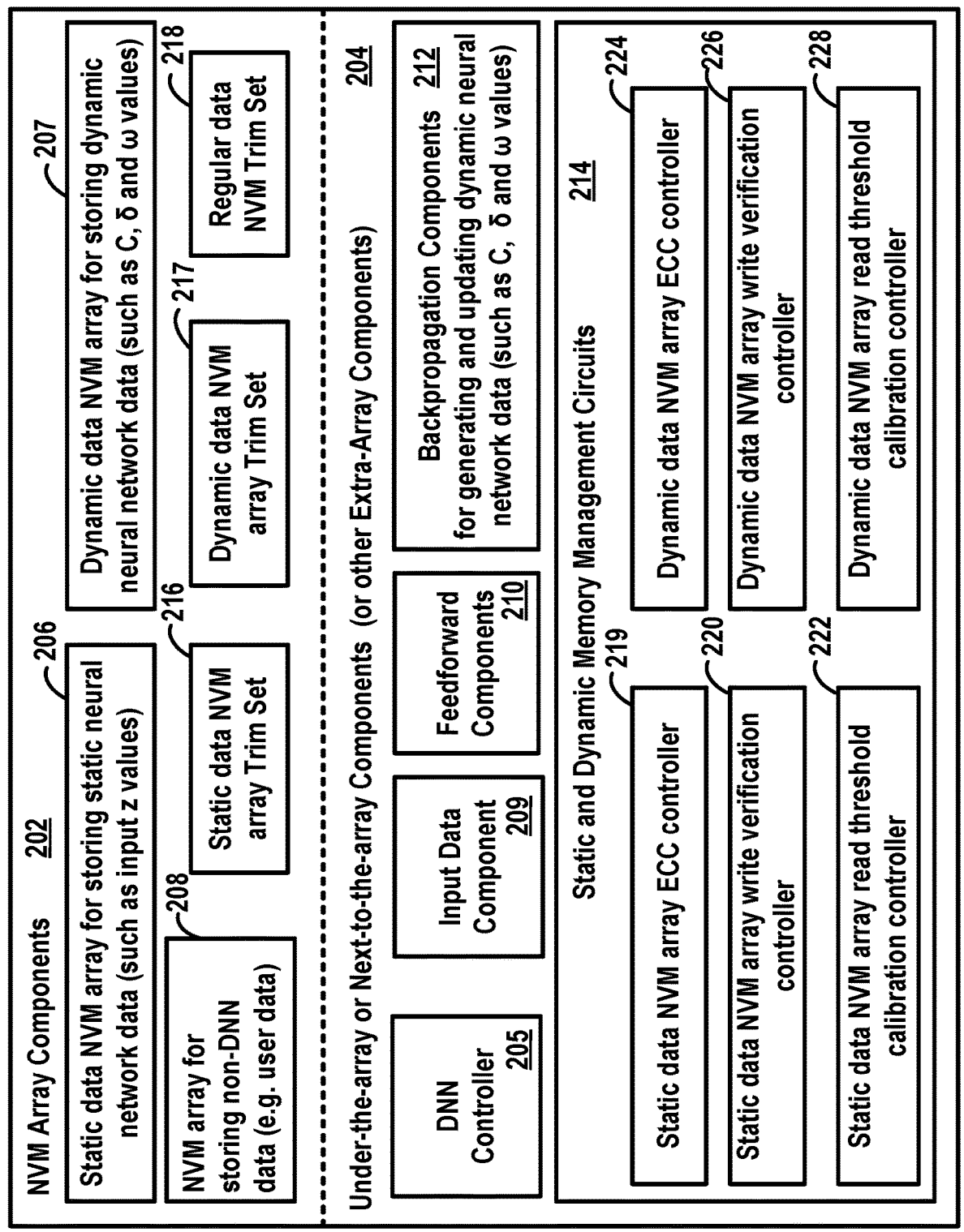
FIG. 2 illustrates an example of an NVM die having extra-array components configured for neural network processing and having separate partitions or arrays for storing static and dynamic neural network data.

FIG. 2 illustrates a block diagram of an exemplary NVM die 200 that includes NVM storage array components 202 and under-the-array or next-to-the-array (or other extra-array) processing components 204 including a DNN controller 205. (Note that not all circuits or memory components used in a practical NVM die are illustrated, such as voltage regulation components, clock and timing components, etc. Rather only some illustrative components and circuits are shown, summarized as blocks or schematics.) The NVM array components 202 include a static data NVM array 206 configured for storing static neural network data (such as input z values) and a dynamic data NVM array 207 configured for storing dynamic neural network data (such as C and δ and ω values). One or more additional NVM arrays 208 store other data such as user data or other non-neural network data.

In the example of FIG. 2, the NVM processing components 204 include: the DNN controller 205 for controlling and managing all DNN operations on the NVM die 200; an input component 209 for receiving and storing input data (such as input neural network data for storage in the static NVM array 206 and default or initial values for trim settings); feedforward components 210 configured to perform feedforward neural network operations, such as computing values in accordance with Equation 1; and backpropagation components 212 configured to perform backpropagation neural network operations, such as to compute values in accordance with Equations 5-8, such as C, δ and ω values that may be obtained via backpropagation from input static z values obtained from static data NVM array 206.

Following die manufacture, three separate trim sets may be specified and stored on the NVM die 200 to provide separate configurations for the static data, dynamic data, and regular data NVM arrays 206, 207, 208, respectively. The trim sets may be initially stored in a boot partition (not separately shown in FIG. 2) and then read from the boot partition and written to a portion of NVM array 202 during power-up and initialization of the NVM die. In the example of FIG. 2, three exemplary trim sets are illustrated: static data NVM trim set 216, dynamic data NVM trim set 217, and regular data NVM trim set 218. The static data NVM array trim set 216 (also referred to herein as "static data NVM access parameters" or a "first set of NVM access parameters") are used for configuring the static NVM array 206. The dynamic data NVM array trim set 217 (also referred to herein as "dynamic data NVM access parameters" or a "second set of NVM access parameters") are used for configuring the dynamic NVM array 207. The regular data NVM array trim set 218 (also referred to herein as "regular data NVM access parameters" or a "third set of NVM access parameters") are used for configuring the NVM array 208 that stores non-DNN data. Note that the various trim parameters may also be referred to herein generally as "NVM access parameters."

FIG. 3 illustrates the exemplary trims sets 216, 217, and 218, which may be stored in different registers on the NVM die. As shown, each trim set includes, in this example, a program (write) voltage setting, a program (write) pulse width, a program (write) threshold setting, a read threshold setting, an ECC ON/OFF setting, a number of ECC bits to be used when ECC is on, a write verification ON/OFF setting, a number of write verification pulses to be used when write verification is on, and one or more read threshold calibration parameters, such as values indicating how often read threshold calibration is to be performed. In some examples, still other trim settings may be stored such as electrical current settings. Hence, the list is not exhaustive. By way of example, ECC may be: set ON for regular data memory with three ECC bits, set ON for static data memory with one ECC bit, and set OFF for dynamic data memory. In the example, write verification may be: set ON for regular data memory with three write verification pulses, set ON for static data memory with one write verification pulse, and set OFF for dynamic data memory. In the example, read calibration may be: set ON for each of the memory types, with the read calibration frequency set to once per day for static data memory, once every few minutes for dynamic data memory, and set to once every hour for regular data memory. These are, of course, just exemplary values. Insofar as the various voltage values, pulse widths, etc., these will depend on the particular memory type (e.g. NAND vs ReRAM, single-layer cell (SLC) vs. multi-layer cell (MLC), etc.) and the details of the read and write circuitry and so no specific values are provided herein. However, in an example where these parameters are adjusted to control BER, the parameters may be: set to whatever values are needed to minimize BER for use with regular data; set to values 5% off of those values for static data memory increase BER within the static data, and set to values 10% off for dynamic data memory to provide a still further increase in BER within the dynamic data.

At least some of the particular values of the static NVM array trim set 216 may be set following die manufacture (and thereafter adaptively adjusted) to values selected to provide for enhanced (e.g. greater or better) data retention and write endurance (as compared to a levels achieved for dynamic data stored in dynamic NVM array 207 of FIG. 2). Conversely, at least some of the particular the particular values of the dynamic NVM array trim set 217 may be set following die manufacture (and thereafter adaptively adjusted) to values selected to provide for (e.g. greater or better) data read/write performance (as compared to a level of data read/write performance achieved for static data stored in static NVM array 206 of FIG. 2). The criteria that defines what constitutes "enhanced," "greater" or "better" retention, endurance, or performance may depend on the particular parameter or characteristic. For example, for data retention, enhanced retention may be defined in terms of how long the data can be reliably stored, with trim parameters that achieve longer reliable storage providing enhanced data retention as compared to trim parameters that yield shorter reliable storage. For write performance, enhanced performance may be defined in terms of how fast data can be written, with trim parameters that achieve faster writes providing enhanced write performance as compared to trim parameters that yield slower writes. The particular trim values of the regular NVM array trim set 218 for configuring other portions of the NVM array 208 may be set following die manufacture (and thereafter adaptively adjusted) to values appropriate for use with regular (non-DNN) data.

Returning to FIG. 2, the static and dynamic memory management circuits 214 include, as shown, separate circuits or components for adaptive trim control. The static and dynamic memory management circuits 214 include a static data NVM array ECC controller 219, a static data NVM array write verification controller 220, a static data NVM array read threshold calibration controller 222, a dynamic data NVM array ECC controller 224, a dynamic data NVM array write verification controller 226, and a dynamic data NVM array read threshold calibration controller 228. Although not specifically shown, other circuits may be provided for controlling other trim settings for the static and dynamic data NVM arrays, such as for controlling particular voltage thresholds, etc. Additionally, other circuits may be provided for controlling the trim settings of the regular (non-DNN) data NVM arrays.

Once the NVM arrays 206, 207, 208 are initially configured, the input data component 209 inputs neural network data (such as training data or z data) and stores the input data in the static NVM array 206. Thereafter, the feedforward components 210 and backpropagation components 212 process the input data to generate dynamic data (e.g., C and 6 and co values) that are stored in the dynamic data NVM array 207.

The feedforward components 210 are configured to perform feedforward neural network operations, such as computing values in accordance with Equation 1, above. Although not shown in FIG. 2, the feedforward components 210 may include: multiplication circuits configured to compute the products of synaptic weights and activation values (as in, e.g., Equation 1); summation circuits configured to sum such products (as in, e.g., Equation 1); bias addition circuits configured to add bias values to the sums (as in, e.g., Equation 1); and RLU/sigmoid function circuits configured to compute RLU or sigmoid functions of the resulting values (as in, e.g., Equation 1). A plurality of each of feedforward circuits may be configured to operate in parallel, e.g., N separate parallel feedforward circuits may be provided for each of the N layers of a neural network.

The backpropagation components 212 are configured to perform backpropagation neural network operations, such as to compute values in accordance with Equations 5-8, above, such as C, $\delta$ and $\omega$ values that may be obtained via backpropagation from input static z values obtained from static data NVM array 206. The dynamic values generated by the backpropagation components 212 (e.g. C, $\delta$ and $\omega$ values) are stored in dynamic data NVM arrays 207. Although not shown in FIG. 2, the backpropagation components 212 may include: weight update determination circuits configured to compute updates to the synaptic weights (as in, e.g., Equations 5-8) for storage in dynamic data NVM arrays 207. A plurality of backpropagation circuits may be configured to operate in parallel, e.g., N separate parallel backpropagation circuits may be provided for each of the N layers of a neural network.

The feedforward operations and backpropagation operations may be performed iteratively or sequentially using the various weight and bias values of a neural network stored in the NVM array 202, as well as activation values or training values input from an SSD. Once a full series of neural network computations has been completed, such as a full set of feedforward computations to generate a final output result, or a full set of backpropagation computations to update the synaptic weights, a suitable notification signal or indicator value may be sent to the SSD controller using an output component (not shown in FIG. 2).

In use, the static and dynamic NVM arrays 206 and 207 may be adaptively reconfigured by the memory management circuits 214 to adjust the various trim settings to achieve desired results, such as to achieve an increase in BER (if warranted) or a decrease in BER (if warranted). In one particular example, if the neural network processing is unreliable due to overfitting, the dynamic data NVM array 207 may be re-configured to increase BER to achieve a desired level of regularization of the neural network. So, for example, if overfitting is detected by DNN controller 205 (using techniques, discussed below), the dynamic data NVM array ECC controller 224 may reduce a number of ECC bits for use in storing DNN data to, e.g., one parity bit or deactivate ECC completely so as to achieve a particular desired BER (to cause or achieve, for example, a particular threshold number of bit flips in the co values to prevent overfitting and achieve DNN regularization). In another particular example, if the neural network processing is too slow, the write verification controller 226 may deactivate write verification for the dynamic DNN data to increase write performance. In another particular example, if the temperature of the NVM die 200 changes, the static data NVM array read threshold calibration controller 222 may increase a frequency of read threshold calibration procedures to prevent read problems. In still other examples, read and write voltage thresholds may be adjusted to increase or decrease BER to affect regularization.

Figure 4:
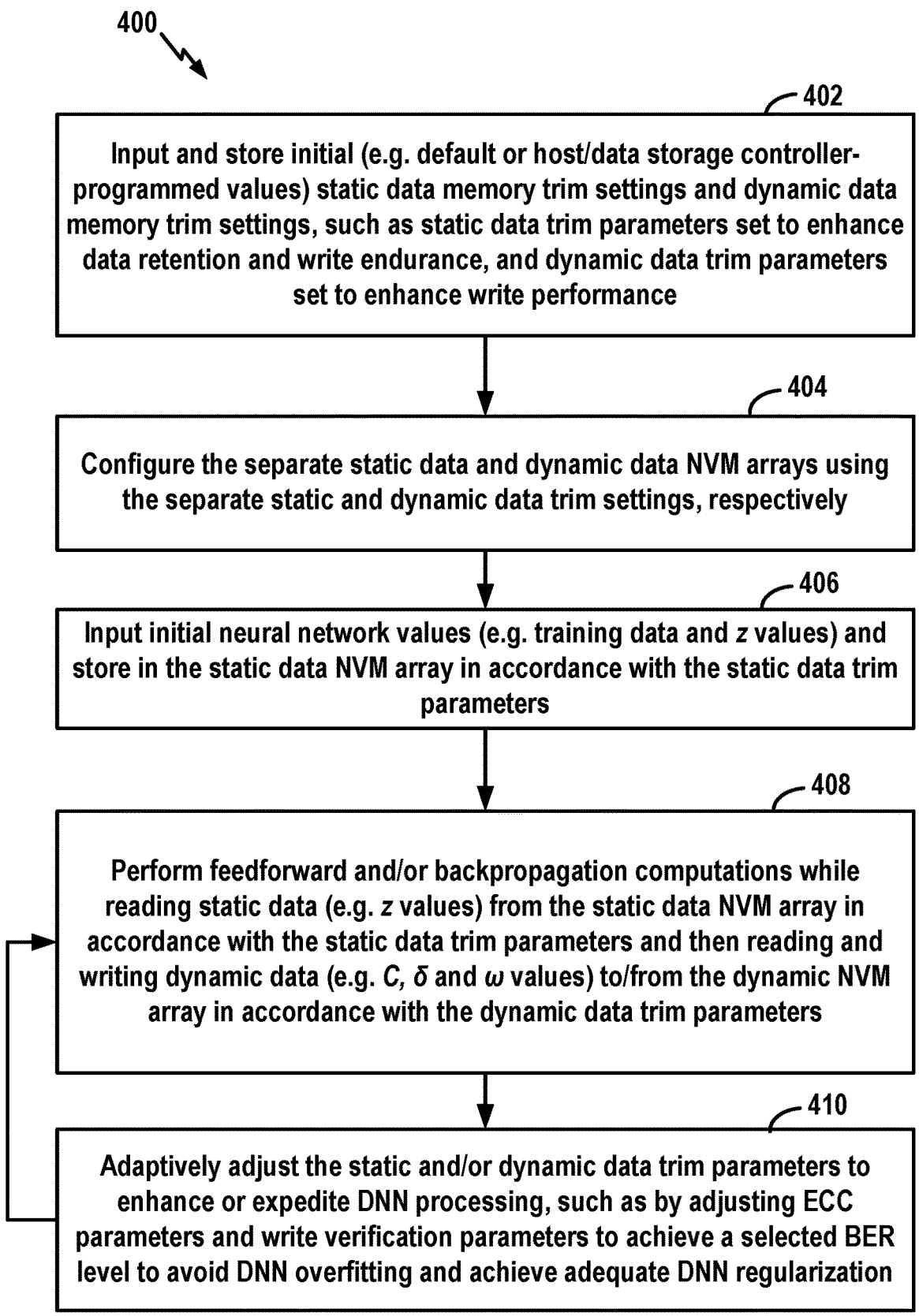
FIG. 4 illustrates a flow chart of an exemplary method according to aspects of the present disclosure for separately adjusting static data and dynamic data trim parameters.

FIG. 4 illustrates an exemplary procedure 400 that may be performed by the NVM die of FIG. 2 using the parameters of FIG. 3. Beginning at block 402, the NVM die inputs and stores initial (e.g. default or host/data storage controller-programmed values) static data memory trim settings (i.e. static data NVM access parameters) and the dynamic memory trim settings (i.e. dynamic data NVM access parameters), such as static data trim parameters set to (or initialized to) enhance data retention within static data NVM arrays (as compared to data retention for dynamic data NVM arrays) and dynamic data trim parameters set to (or initialized to) enhance write performance within dynamic data NVM arrays (as compared to data retention for other portions of the NVM array). For example, enhanced data retention and write endurance of static DNN data may be achieved in the static data NVM array (as compared to data retention for the dynamic data NVM arrays) by performing write verification using several pulses to ensure the data is properly stored with ample data retention safety margins. Enhanced write speeds for dynamic DNN data may be achieved in the dynamic data NVM array (as compared to write speeds for other portions of the NVM array) by disabling write verification and/or disabling ECC. Although not shown in FIG. 4, trim settings for other portions of the NVM die (e.g. regular data arrays for storing non-DNN data) may be input as well. As already noted, initial values for the various trim settings may be stored in boot memory.

At block 404, the NVM die configures (or initializes) the separate static data and dynamic data NVM arrays using the separate static and dynamic data trim settings, respectively, such as by programming read and write circuitry coupled to the arrays using the trim setting values (e.g. by programming the read and write circuits to use the voltage thresholds specified within the input trim settings read from registers). The particular read and write circuitry and the manner by which trim values are applied to read and write data to/from memory elements depends on the particular memory type (e.g. NAND vs ReRAM, single-layer cell (SLC) vs. multi-layer cell (MLC), etc.). Those skilled in the art understand the application of trim settings to read and write circuitry. Further information may be found, e.g., in U.S. Published Patent Application 2016/0099057, entitled "BLOCK REFRESH TO ADAPT TO NEW DIE TRIM SETTINGS" and U.S. Published Patent Application 2016/0077968, entitled "SYSTEM AND METHOD FOR CONFIGURING AND CONTROLLING NON-VOLATILE CACHE," both of which are assigned to the assignee of the present application. Note that the operations of block 402 serve to initialize a first set of NVM elements using a first set of NVM access parameters prior to storing static data in the first set of NVM elements and serve to initialize a second set of NVM elements using a second set of NVM access parameters prior to storing dynamic data in the first set of NVM elements. At block 406, the NVM die inputs initial neural network values (e.g. training data and z values) and stores that values in the static data NVM array in accordance with the static data trim parameters. At block 408, the NVM die performs feedforward and/or backpropagation computations while reading static data (e.g. z values) from the static data NVM array in accordance with the static data trim parameters and then reading and writing dynamic data (e.g. C, δ and ω values) to/from the dynamic NVM array in accordance with the dynamic data trim parameters. At block 410, the NVM die adaptively adjusts the static and/or dynamic data trim parameters to enhance or expedite DNN processing, such as by adjusting ECC parameters or write verification parameters to achieve a selected BER level to avoid DNN overfitting (and thus achieve adequate DNN regularization). Following adaptive adjustments to the trim parameters, further feedforward and/or backpropagation computations may be performed at block 408.

Figure 5:
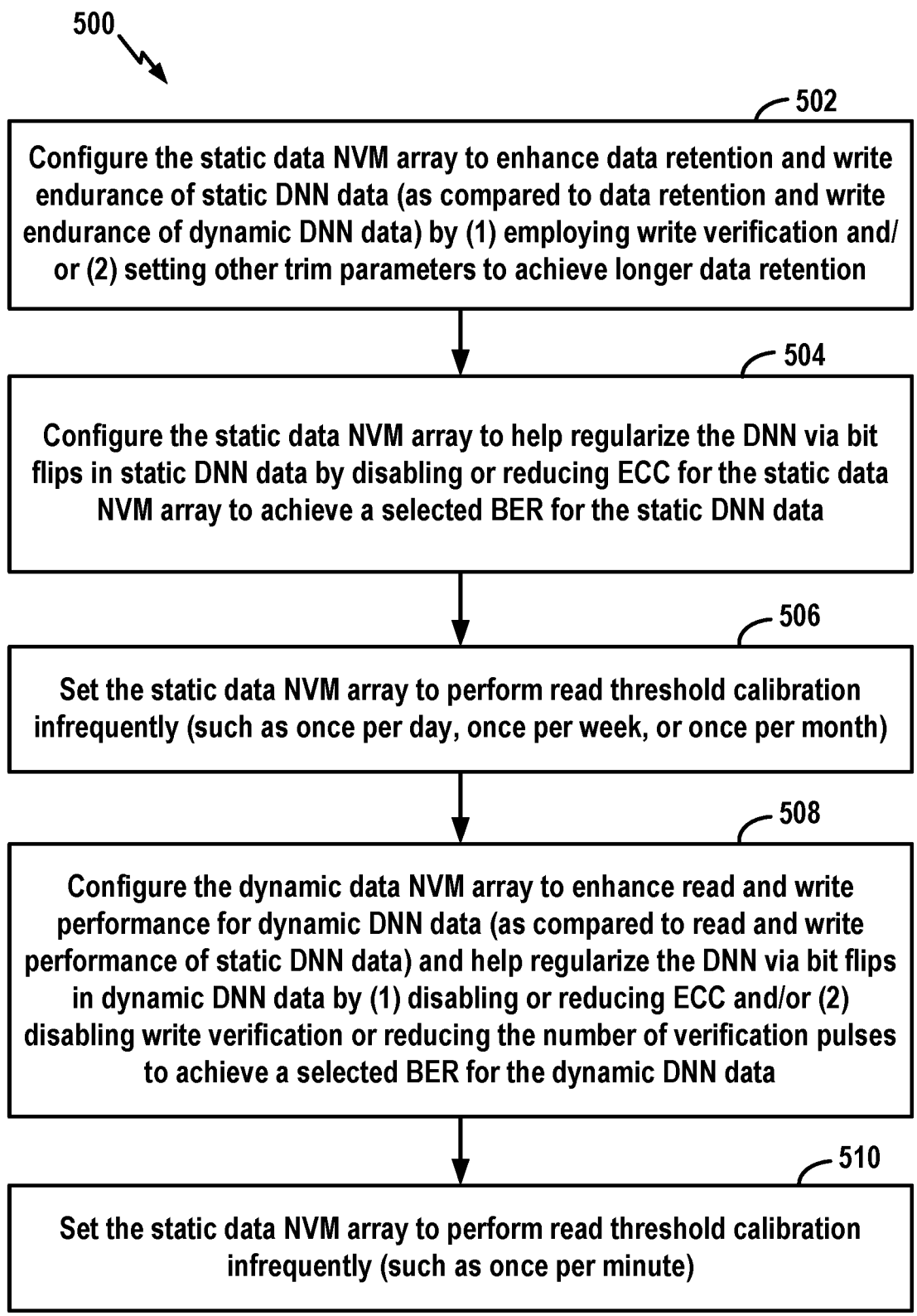
FIG. 5 illustrates a flow chart of an exemplary method according to aspects of the present disclosure for separately configuring static data and dynamic data memory arrays.

FIG. 5 illustrates procedures 500 that may be performed by the NVM die of FIG. 2 using the parameters of FIG. 3 for achieving certain exemplary goals, such as an improvement in read and write performance or regularization of a DNN. Beginning at block 502, the NVM die configures its static data NVM array to enhance data retention and write endurance of static DNN data (as compared to a level of data retention and write endurance of dynamic DNN data stored in the dynamic data NVM array) by (1) employing write verification for the static DNN data and/or (2) setting other trim parameters (such as voltage thresholds) to achieve longer data retention. At block 504, the NVM die configures its static data NVM array to help regularize the DNN via bit flips in static DNN data by disabling or reducing ECC for the static data NVM array to achieve a selected BER for the static DNN data, such as a pre-preprogrammed static data BER level or a level that is adaptively adjusted based on intermediary DNN results. At block 506, the NVM die sets its static data NVM array to perform read threshold calibration infrequently (such as once per day, once per week, or once per month). At block 508, the NVM die configure its dynamic data NVM array to enhance read and write performance for dynamic DNN data (as compared to read and write performance of static DNN data) and help regularize the DNN via bit flips in dynamic DNN data by (1) disabling or reducing ECC and/or (2) disabling write verification or reducing the number of verification pulses. The selected BER for the dynamic DNN data may be different from the selected BER for the static DNN data and may be a pre-preprogrammed dynamic data BER level or a level that is adaptively adjusted based on intermediary DNN results. At block 510, the NVM die sets its dynamic data NVM array to perform read threshold calibration frequently (such as once per minute).

Figure 6:
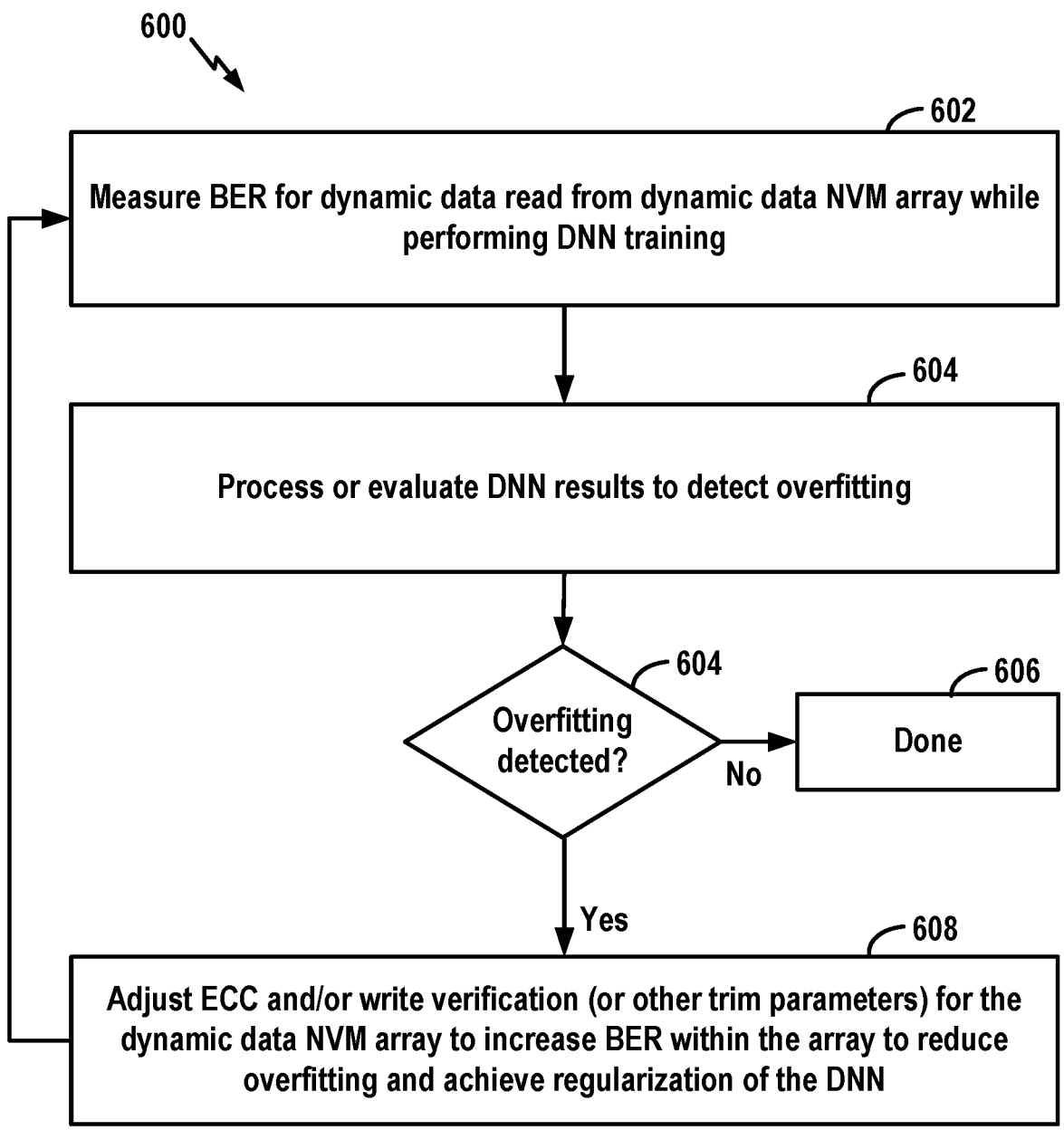
FIG. 6 illustrates a flow chart of exemplary operations for adjusting error correction coding (ECC) procedures to avoid DNN overfitting.

FIG. 6 illustrates procedures 500 that may be performed by the NVM die of FIG. 2 for preventing or remedying overfitting within a DNN. Beginning at block 602, the NVM die tracks its BER for dynamic data read from dynamic data NVM array while performing DNN training. At block 604, the NVM die processes or evaluates its DNN results to detect overfitting. Overfitting may be detected, for example, by separately processing multiple different data sets, such as a training set, a cross-validation set (or a "hold-out" set) and test set. If the DNN performs much better on the training set than on the test set, then overfitting likely has occurred. For example, if the DNN achieves 90% accuracy on a training set but only 50% accuracy on the test set, overfitting is likely. If no overfitting is detected, processing ends at block 606. If overfitting is detected, the NVM die adjusts ECC and/or write verification (or other trim parameters) for its dynamic data NVM array to increase BER within the array in an effort to overcome the overfitting. Processing again returns to block 602 for re-processing DNN data to, for example, re-train the DNN. Although the example of FIG. 6 applies to dynamic DNN data in the dynamic data NVM array, the BER of static data can be tracked as well and trim parameters for the static data NVM array may be adjusted to increase its BER, such as by deactivating ECC for data read from the static data NVM.

Figure 7:
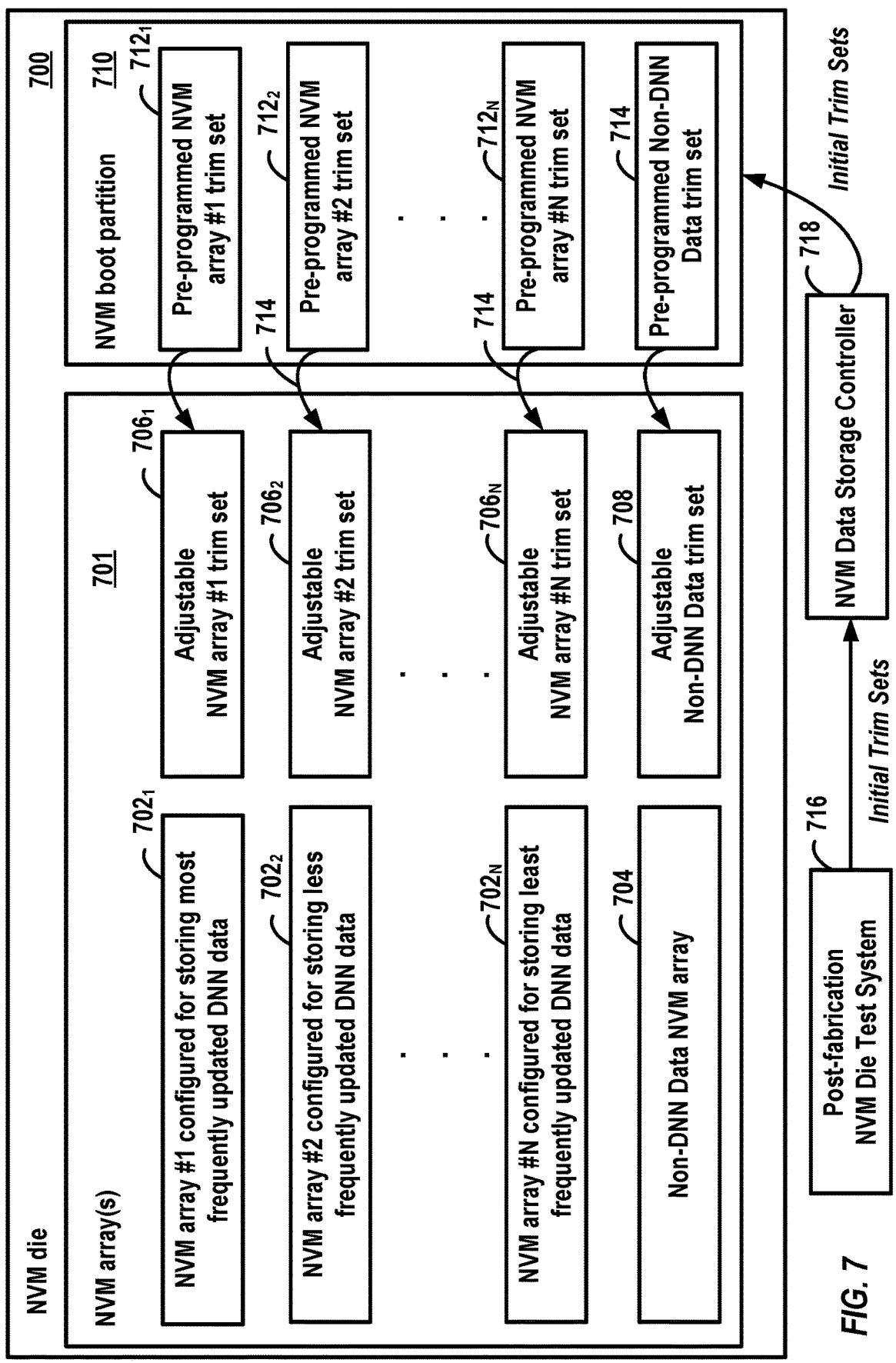
FIG. 7 illustrates an example of an NVM die having multiple NVM arrays and multiple corresponding NVM array trim sets that are pre-set and then adaptively adjusted.

FIG. 7 illustrates an NVM die 700 having NVM array(s) 701 including a set of individual NVM arrays $702_1$-$702_N$ configured for use with different levels, degrees or gradations of dynamic vs. static data. NVM array $702_1$ is configured to store the most frequently updated DNN data and NVM array $702_N$ is configured to store the least frequently updated DNN data. In examples where there is static DNN data, the NVM array $702_N$ may be the static data NVM array. Also shown is a non-DNN NVM array 704 configured for storing non-DNN data, such as user data. Each of the arrays has a corresponding adjustable NVM array trim set: $706_1$-$706_N$ and 708 that maintain trim values and parameters that can be adaptively adjusted or modified by suitable controller (such as the memory management circuits 214 of FIG. 2). Also shown is an NVM boot partition 710 that stores initial pre-programmed NVM array trim sets 712-$712_N$ and 714 that may be set differently from one another following die manufacture by a suitably-programmed post-fabrication NVM die test (calibration) system 716. The initial trim sets may be programmed into the NVM boot partition 710 using a NVM data storage controller 718 or other suitable device.

Initial values for the trim parameters within the trim sets 712-$712_N$ and 714 may be determined and set by test system 716 based, e.g., on measured voltage calibration values for the particular NVM die and on the expected frequency of update of DNN data to be stored in the corresponding NVM arrays $702_1$-$702_N$ and 704 to provide selected or desired features, such as enhanced write performance for more frequently updated DNN data and enhanced write endurance for less frequently updated DNN data, as already discussed. During power-up and initialization of the NVM die 700, the pre-programmed trim sets are transferred into the NVM array(s) 710 (as shown by way of arrows 714) for use in configuring and accessing the NVM arrays $702_1$-$702_N$ and 704. Thereafter, parameters within the trim sets $706_1$-$706_N$ and 708 may be adaptively adjusted, as described above, by an on-chip controller (such as the memory management circuits 214 of FIG. 2) to achieve various goals such as increasing or decreasing BER by, for example, controlling ECC or write verification.

Figure 8:
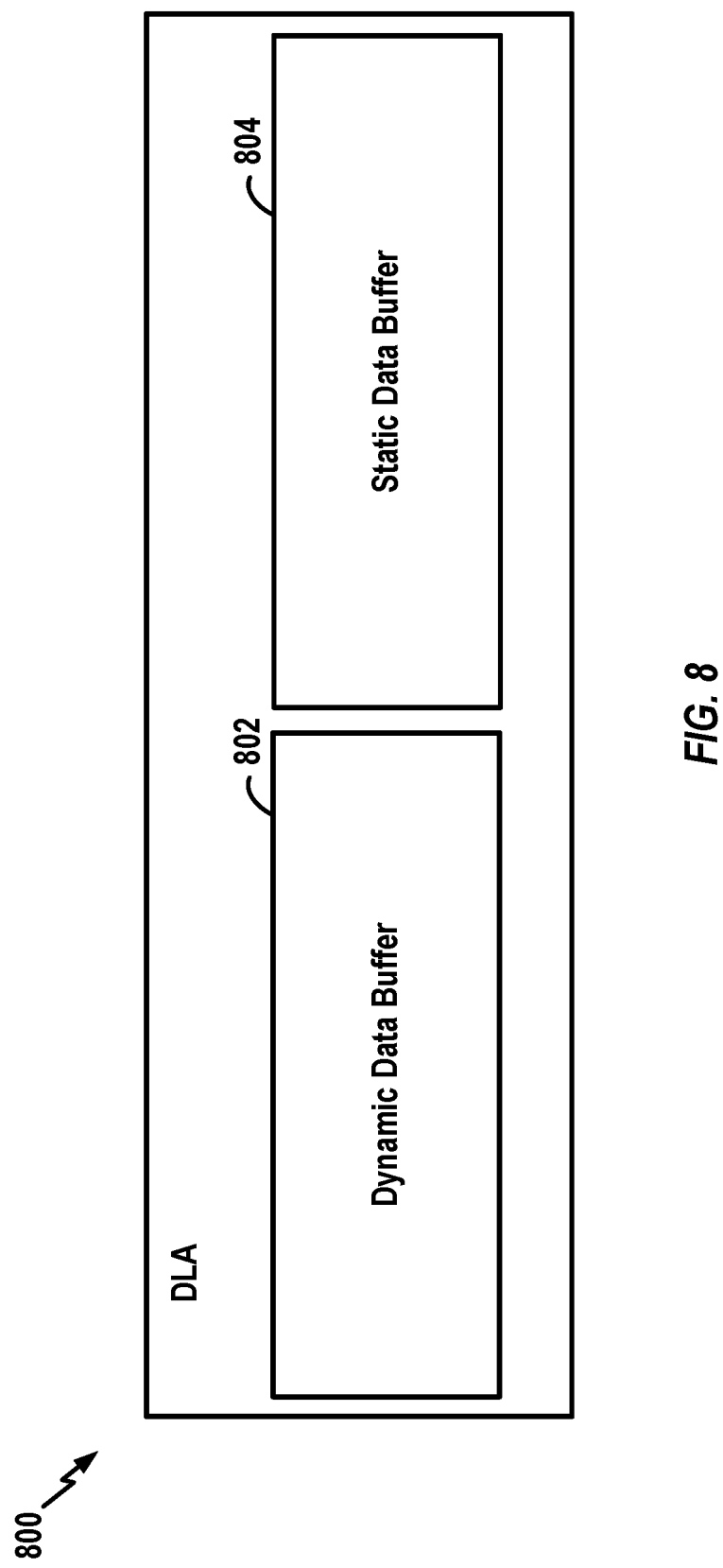
FIG. 8 illustrates an example of a DLA device having a dynamic data buffer and a static data buffer.

FIG. 8 illustrates a DLA 800 having a separate dynamic data buffer 802 and a static data buffer 804. An example of a DLA is the on-chip DNN systems and circuits discussed above, such as with reference to FIG. 2. An example of a dynamic data buffer is one or more of the dynamic data NVM arrays discussed above. An example of a static data buffer is one or more of the static data NVM arrays discussed above. However, other devices and apparatus may form the DLA 800, dynamic data buffer 802, and the static data buffer 804. FIG. 8 is provided, in part, to illustrate and emphasize the general applicability of features described herein to other systems besides those of FIGS. 1-7.

Figure 9:
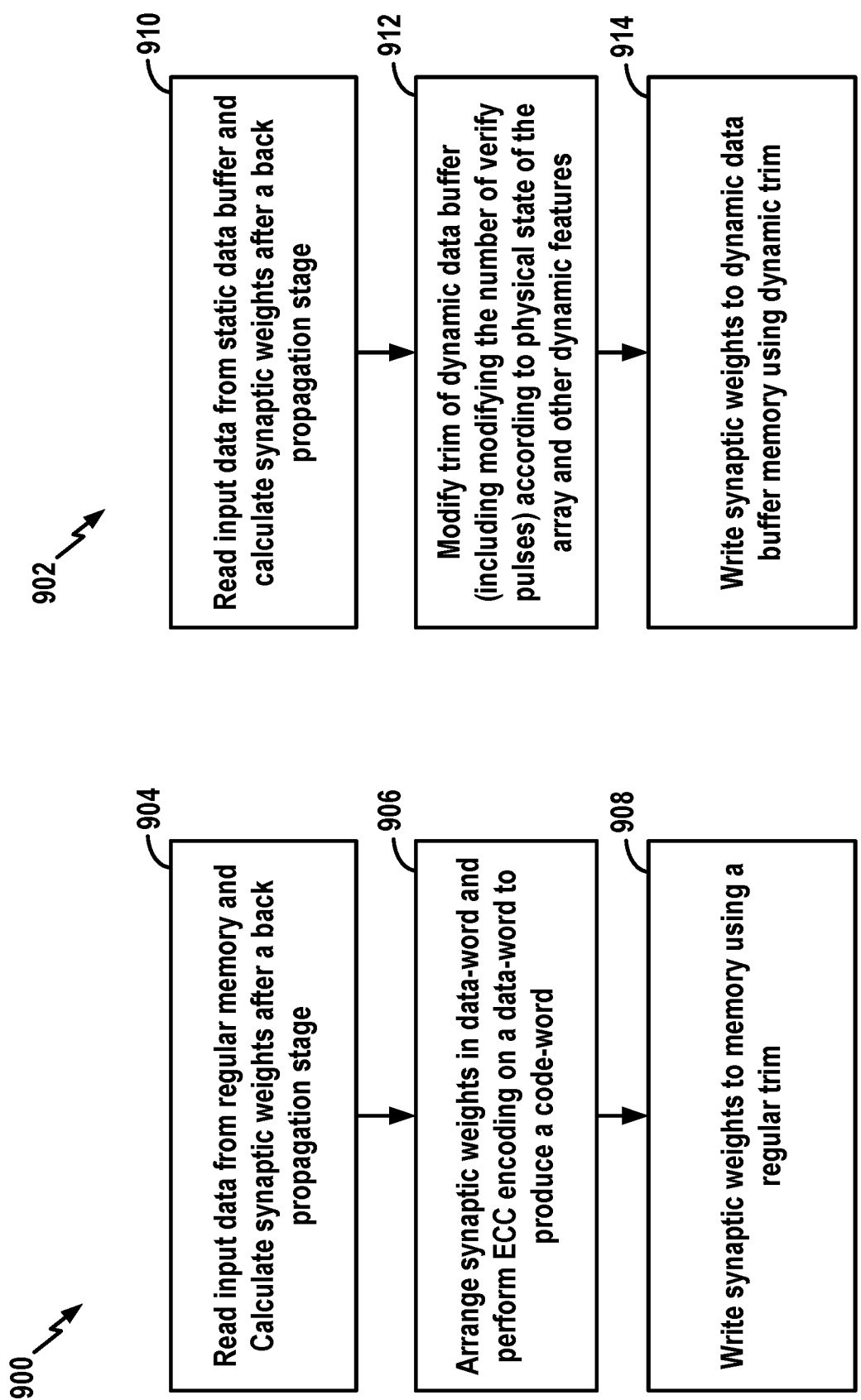
FIG. 9 illustrates flow charts that contrast exemplary procedures for generating and storing synaptic weights using the DLA device of FIG. 8, including a first procedure that does not use dynamic trim and a second procedure that uses dynamic trim.

FIG. 9 illustrates a pair of processes 900 and 902 in accordance with some aspects of the disclosure. The process 900 does not use a dynamic trim (where dynamic trim refers to trim settings that are dynamically adjustable). The process 902 uses a dynamic trim. Briefly, beginning at block 904 of process 900, a DLA having memory configured using a regular trim set reads input data (such as z values) from its regular memory (e.g. a memory configured using standard memory trim values) and calculates synaptic weights (w) after a backpropagation DLA stage. At block 906, the DLA arranges the synaptic weights in a data-word and performs ECC encoding on a data-word to produce a code-word. At block 908, the DLA writes the synaptic weights to its memory using a regular trim. That is, in process 900, separate trims are not provided for separate data buffers or arrays. In contrast, in process 902, beginning at block 910, a DLA configured as in FIG. 8 reads input data (such as z values) from its static data memory (or buffer) and calculates synaptic weights (w) after a backpropagation DLA stage. At block 912, the DLA modifies trim settings of its dynamic data memory or buffer (including modifying a number of write verify pulses) according to physical state of the array and other dynamic features. By "modifying according to physical state of the array," it is meant that the trim settings may be modified, for example, based on current BER values or current temperatures, etc., as already described. At block 914, the DLA writes the synaptic weights to its dynamic data buffer memory using dynamic trim (e.g. using a dynamically adjusted trim set, as described above).

In the following, various general exemplary procedures and systems are described.

Additional Exemplary Procedures and Apparatus

Figure 10:
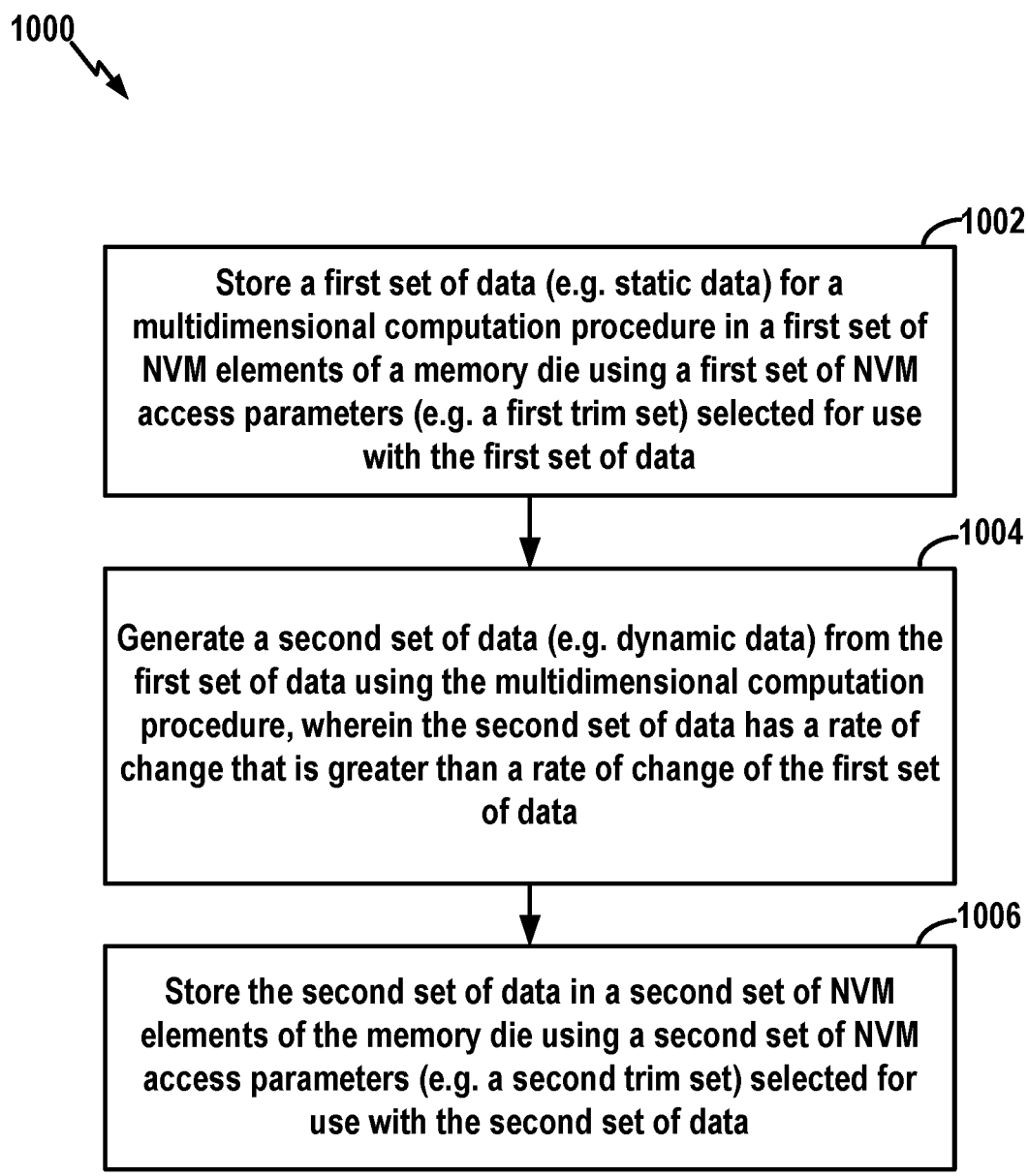
FIG. 10 illustrates a flow chart that summarizes exemplary operations performed by an NVM die.

FIG. 10 illustrates a process 1000 in accordance with some aspects of the disclosure. The process 1000 may take place within any suitable apparatus or device capable of performing the operations, such as an NVM die with on-chip processing circuitry. At block 1002, the memory apparatus (e.g. a NVM die) stores a first set of data (e.g. static data) for a multidimensional computation procedure (such as z values for a DNN backpropagation procedure) in a first set of NVM elements using a first set of NVM access parameters (e.g. a first trim set, such as a static data NVM trim set) selected for use with the first set of data. At block 1004, the memory apparatus generates a second set of data (e.g. dynamic data) from the first set of data using the multidimensional computation procedure (such as by performing DNN backpropagation to compute ω values), wherein the second set of data has a rate of change that is greater than a rate of change of the first set of data. At block 1006, the memory apparatus stores the second set of data in a second set of NVM elements using a second set of NVM access parameters (e.g. a second trim set, such as a dynamic data NVM trim set) selected for use with second set of data. The NVM access parameters may define how read and write accesses to the first set of NVM elements and the second set of NVM elements are to be performed. As explained above, static data NVM trim set may have values selected to enhance data retention and write endurance (at least as compared to a level of data retention and write endurance achieved for dynamic data using the dynamic data NVM trim set). Dynamic data NVM trim set may have values selected to enhance read and write performance (at least as compared to a level of read and write performance achieved for static data using the static data NVM trim set). As also noted, additional sets of NVM elements and corresponding sets of NVM access parameters may be provided, such as NVM elements for storing regular user data.

Figure 11:
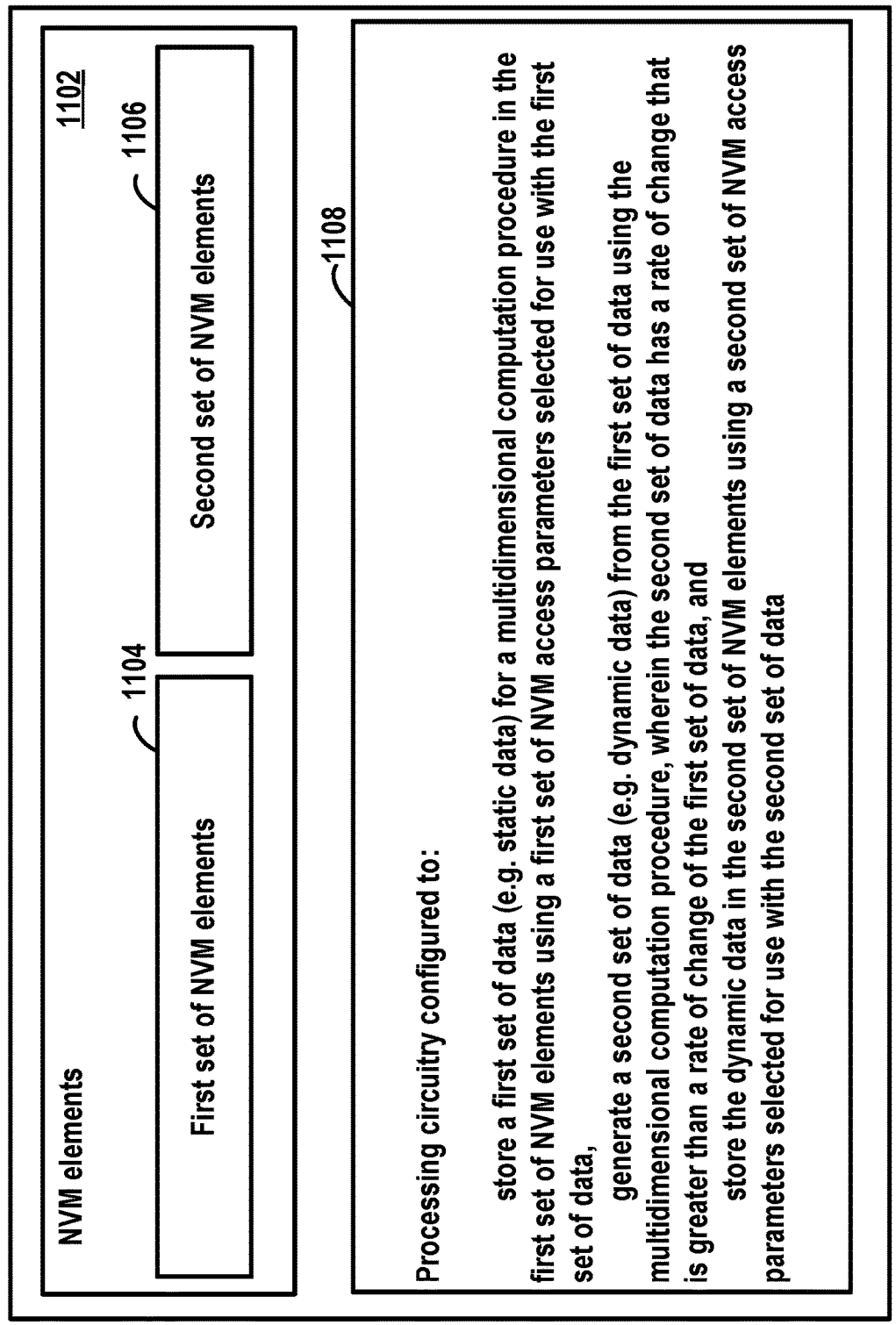
FIG. 11 illustrates a schematic block diagram configuration for an exemplary NVM apparatus, such as an NVM die.

FIG. 11 illustrates an NVM die configured in accordance with some aspects of the disclosure. The NVM die 1100 includes a set of NVM elements 1102 including a first set of NVM elements 1104 and a second set of NVM elements 1106. The NVM die 1100 also includes processing circuitry or a controller 1108 configured to: store a first set of data (e.g. static data) for a multidimensional computation procedure (such as a DNN backpropagation procedure) in the first set of NVM elements using a first set of NVM access parameters selected for use with the first set of data, generate a second set of data (e.g. dynamic data) from the first set of data using the multidimensional computation procedure, wherein the second set of data has a rate of change that is greater than a rate of change of the first set of data, and store the second set of data in the second set of NVM elements using a second set of NVM access parameters selected for use with the second set of data.

Figure 12:
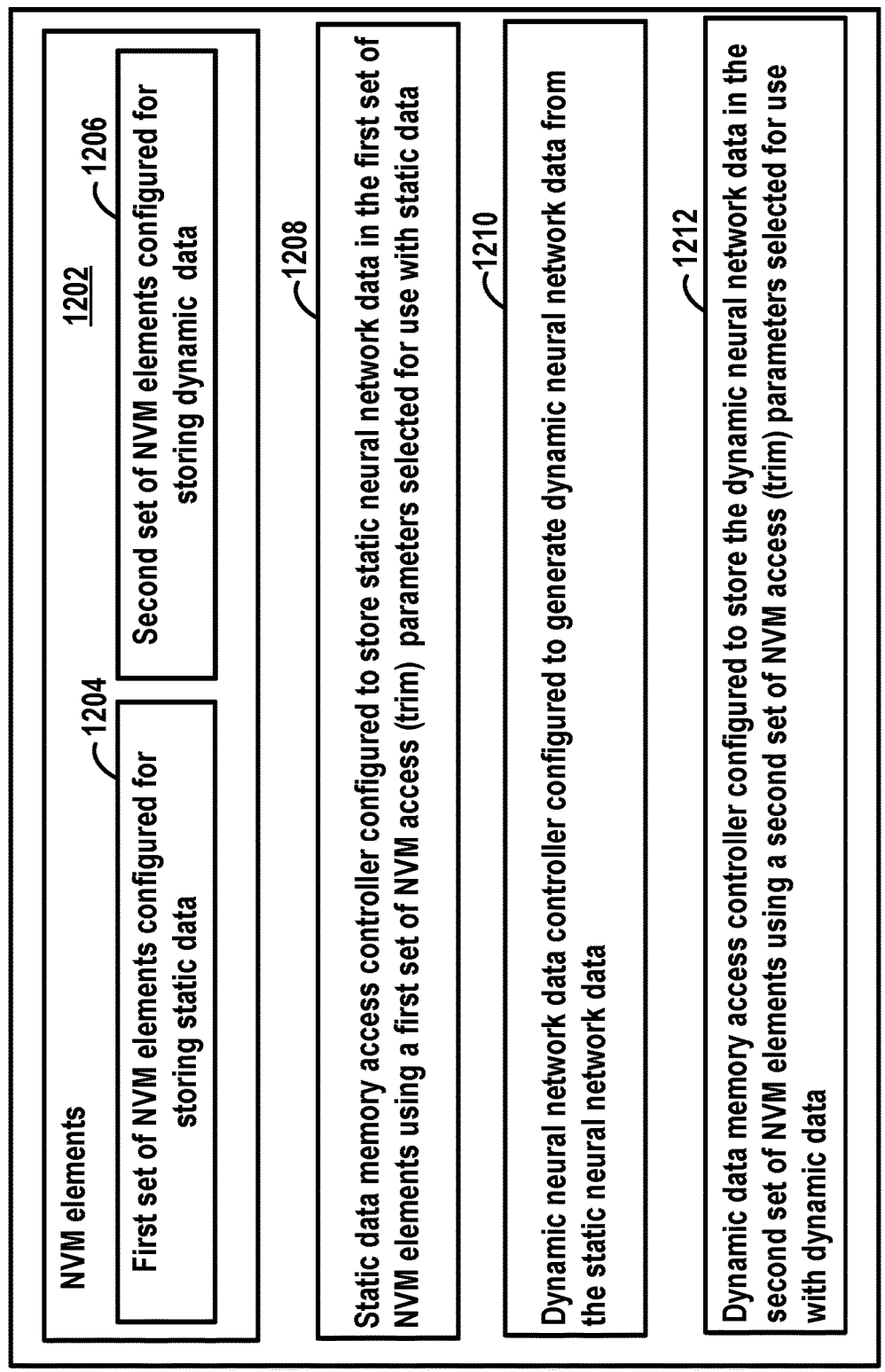
FIG. 12 illustrates a schematic block diagram configuration for another exemplary NVM apparatus, such as an NVM die.

FIG. 12 illustrates another NVM die configured in accordance with aspects of the disclosure. The NVM die 1200 includes a set of NVM elements 1202 including a first set of NVM elements 1204 configured for storing static data and a second set of NVM elements 1206 configured for storing dynamic data. The NVM die 1200 also includes a static data memory access controller 1208 configured to store static neural network data in the first set of NVM elements 1204 using a first set of NVM access (trim) parameters selected for use with static data. A dynamic neural network data controller 1210 is configured to generate dynamic neural network data from the static neural network data. A dynamic data memory access controller 1212 is configured to store the dynamic neural network data in the second set of NVM elements 1206 using a second set of NVM access parameters selected for use with dynamic data.

In at least some examples, means may be provided for performing the functions illustrated in FIG. 10 and/or other functions illustrated or described herein. For example, the means may include one or more of: means, such as the static data memory access controller 1208, formed on a memory die having an array, for storing static data for a multidimensional computation procedure in a first set of NVM elements using a first set of NVM access parameters selected for use with static data; means, such as the dynamic data controller 1210, formed on the memory die, for generating dynamic data from the static data using the multidimensional computation procedure, and means, such as the dynamic data memory access controller 1212, formed on the memory die, for storing the dynamic data in a second set of NVM elements using a second set of NVM access parameters selected for use with dynamic data.

Still further, in at least some examples, non-transitory machine-readable instructions may be provided for controlling the functions illustrated in FIG. 10 and/or other functions illustrated or described herein. For example, the instructions may include one or more of: instructions for storing static data for a multidimensional computation procedure in a first set of NVM elements using a first set of NVM access parameters selected for use with static data; instructions for generating dynamic data using the multidimensional computation procedure from the static data, and instructions for storing the dynamic data in a second set of NVM elements using a second set of NVM access parameters selected for use with the dynamic data.

Figure 13:
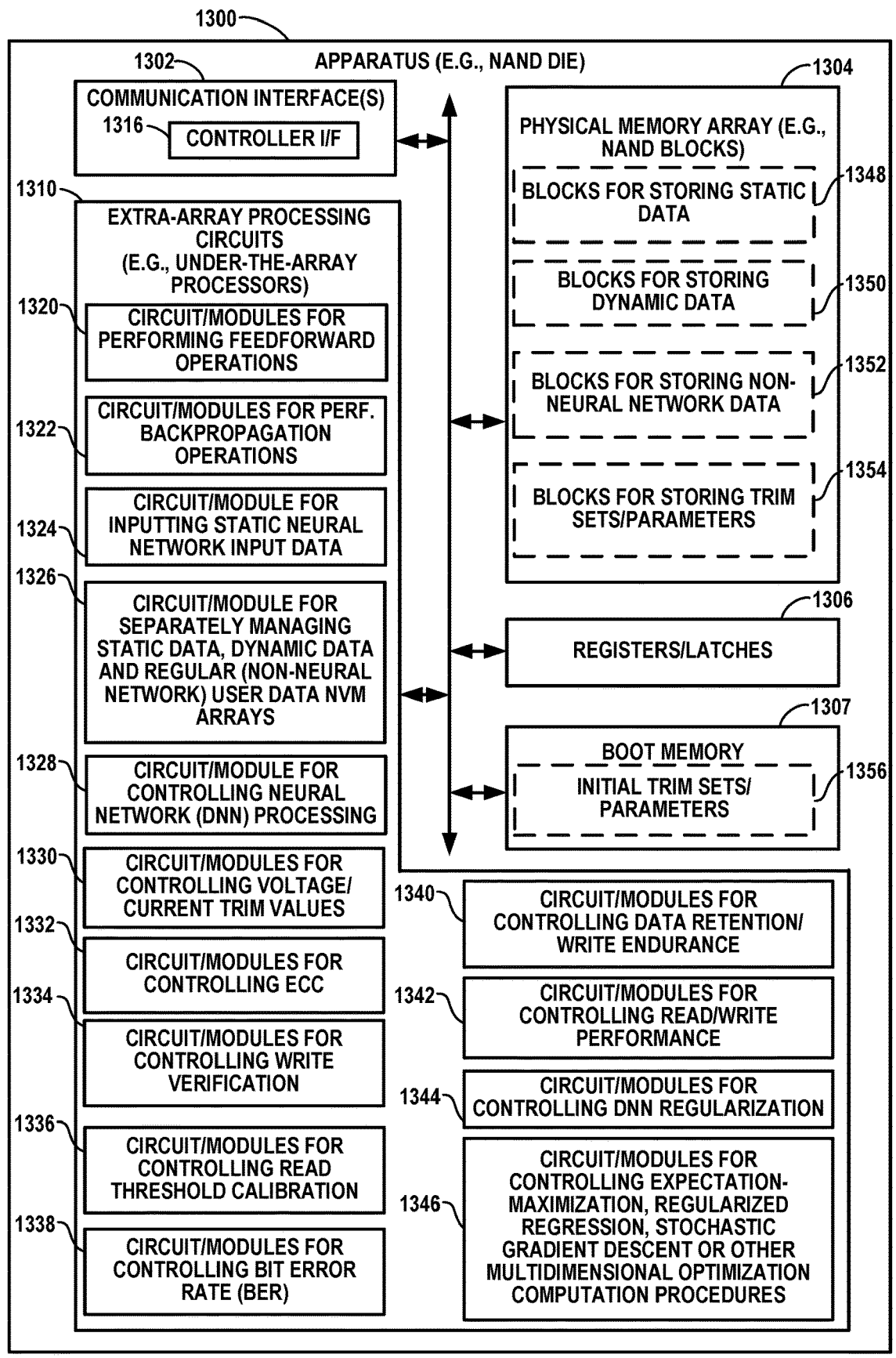
FIG. 13 illustrates a schematic block diagram configuration for yet another exemplary NVM apparatus, such as a NAND die.

FIG. 13 illustrates an embodiment of an apparatus 1300 configured according to one or more aspects of the disclosure. The apparatus 1300, or components thereof, could embody or be implemented within a NAND die or some other type of NVM device that supports data storage. In various implementations, the apparatus 1300, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes or uses neural data.

The apparatus 1300 includes a communication interface 1302, a physical memory array (e.g., NAND blocks) 1304, a set or extra-array (e.g. under-the-array) registers and/or latches 1306, boot memory 1307, and a set of extra-array (e.g. under-the-array (U-A)) processing circuits or processors 1310. These components can be coupled to and/or placed in electrical communication with one another via suitable components, represented generally by the connection lines in FIG. 13. Although not shown, other circuits such as timing sources, peripherals, voltage regulators, and power management circuits may be provided, which are well known in the art, and therefore, will not be described any further.

The communication interface 1302 provides a means for communicating with other apparatuses over a transmission medium. In some implementations, the communication interface 1302 includes circuitry and/or programming (e.g., a program) adapted to facilitate the communication of information bi-directionally with respect to one or more devices in a system. In some implementations, the communication interface 1302 may be configured for wire-based communication. For example, the communication interface 1302 could be a bus interface, a send/receive interface, or some other type of signal interface including circuitry for outputting and/or obtaining signals (e.g., outputting signal from and/or receiving signals into an SSD). The communication interface 1302 serves as one example of a means for receiving and/or a means for transmitting.

The physical memory array 1304 may represent one or more NAND blocks. The physical memory array 1304 may be used for storing data such as input neural network data (e.g. z values) and synaptic weights (e.g. ω values) that are manipulated by the processing circuits 1310 or some other component of the apparatus 1300. The physical memory array 1304 may be coupled to the processing circuits 1310 (via, e.g., registers/latches 1306) such that the processing circuits 1310 can read or sense information from, and write or program information to, the physical memory array 1304. That is, the physical memory array 1304 can be coupled to the processing circuits 1310 so that the physical memory array 1304 is accessible by the processing circuits 1310. The processing circuits 1310 are arranged or configured to obtain, process and/or send data, control data access and storage, issue or respond to commands, and control other desired operations. For example, the processing circuits 1310 may be implemented as one or more processors, one or more controllers, and/or other structures configured to perform functions.

According to one or more aspects of the disclosure, the processing circuits 1310 may be adapted to perform the various on-chip features, processes, functions, operations and/or routines described herein. For example, the processing circuits 1310 may be configured to perform any of the steps, functions, and/or processes described with respect to FIGS. 1-12. As used herein, the term "adapted" in relation to the processing circuit 1310 may refer to the processing circuits 1310 being one or more of configured, employed, implemented, and/or programmed to perform a particular process, function, operation and/or routine according to various features described herein. The processing circuits 1310 may include a specialized processor, such as an application specific integrated circuit (ASIC) that serves as a means for (e.g., structure for) carrying out any one of the operations described in conjunction with FIGS. 1-12. The processing circuits 1310 serves as one example of a means for processing. In various implementations, the processing circuits 1310 may provide and/or incorporate, at least in part, the functionality described above for the extra-array components 204 of FIG. 2.

According to at least one example of the apparatus 1300, the processing circuit 1310 may include one or more of: circuit/modules 1320 configured to perform feedforward operations; circuit/modules 1322 configured to perform backpropagation operations; a circuit/module 1324 configured to input static neural network input data (e.g. z values or training values); a circuit/module 1326 configured to separately manage static data, dynamic data and regular (non-neural network) data NVM arrays (by, e.g. adaptively adjusting the trim sets corresponding to those NVM arrays); circuit/modules 1328 configured to control neural network (e.g. DNN) processing (such as controlling feedforward and backpropagation processing); circuit/modules 1330 configured to control (e.g. adaptively adjust) voltage/current trim values; circuit/modules 1332 configured to control (e.g. adaptively adjust) ECC; circuit/modules 1334 configured to control (e.g. adaptively adjust) write verification; circuit/modules 1336 configured to control (e.g. adaptively adjust) read threshold calibration; circuit/modules 1338 configured to control (e.g. adaptively adjust) BER; circuit/modules 1340 configured to controlling data retention/write endurance (by, e.g., adaptively adjusting trim settings to enhance data retention/write endurance for static data, as discussed above); circuit/modules 1342 for controlling read/write performance (by, e.g., adaptively adjusting trim settings to enhance read/write performance for dynamic data, as discussed above); circuit/modules 1344 for controlling DNN regularization (by, e.g., adaptively adjusting trim settings to increase BER to avoid overfitting, as discussed above); and circuit/modules 1346 for controlling one or more of expectation-maximization, regularized regression, and/or stochastic gradient descent procedures or other multidimensional (minima/maxima) optimization computation procedures (by, e.g., adaptively adjusting trim settings for static and dynamic data stored in connection with those procedures).

As shown in FIG. 13, the physical memory array 1304 may include one or more of: blocks 1348 for storing static data (such as z values); blocks 1350 for storing dynamic data (such as ω values); blocks 1352 for storing non-neural network data (such as user data); and blocks 1354 for trim settings and parameters. The boot memory 1307 may store the initial trim sets/parameters 1356 (in ROM, for example).

In at least some examples, means may be provided for performing the functions illustrated in FIG. 13 and/or other functions illustrated or described herein. For example, the means may include one or more of: means, such as circuit/module 1320, for performing feedforward operations; means, such as circuit/module 1322, for performing backpropagation operations; means, such as circuit/module/component 1324, for inputting static neural network input data (e.g. z values or training values); means, such as circuit/module 1326, for separately managing static data, dynamic data and regular (non-neural network) data NVM arrays (by, e.g. adaptively adjusting the trim sets corresponding to those NVM arrays); means, such as circuit/module 1328, for controlling neural network (e.g. DNN) processing; means, such as circuit/module 1330, for controlling (e.g. adaptively adjusting) voltage/current trim values; means, such as circuit/module 1332, for controlling (e.g. adaptively adjusting) ECC; means, such as circuit/module 1334, for controlling (e.g. adaptively adjusting) write verification; means, such as circuit/module 1336, for controlling (e.g. adaptively adjusting) read threshold calibration; means such as circuit module 1338, for controlling (e.g. adaptively adjusting) BER; means, such as circuit module 1340, for controlling data retention/write endurance; means, such as circuit/modules 1342, for controlling read/write performance; means, such as circuit/modules 1344, for controlling DNN regularization; means, such as circuit/modules 1346, for controlling one or more of expectation-maximization, regularized regression, stochastic gradient descent or other multidimensional (minima/maxima) optimization computation procedures; means, such as storage block 1348, for storing static data; means, such as storage block 1350, for storing dynamic data; and means, such as storage block 1352, for storing non-neural network data (e.g. regular user data); means, such as storage block 1354 for storing trim sets/parameters.

Summary of Various Aspects and Features

Thus, herein, various devices, systems, procedures and apparatus are described that, among other features, exploit the fact that during backpropagation training of neural networks there are two kinds of data stored in memory, static data (the input data sets), which are processed but not changed, and dynamic data (working memory, e.g. synaptic weights), which are changed during the computations. The two data types have different characteristics and requirements and it is beneficial to have different sets of management rules specific for each data type for optimal management of both types. The static data type benefits from enhanced read performance, high data retention, and specifically for DNN, is less sensitive to small BERs and hence can be read with no error correction. The dynamic data memory type benefits from high read and write performances and short term memory storage (as there is often no need to be concerned about data retention on short time scales). Also, BER is not problematic for dynamic data and hence verify after write may be reduced or deactivated.

Special programming trim is thus used for faster programming of the NVM cells and verify operation after write (program) is relaxed and in some cases skipped, which can increase write performance significantly. The "penalty" for relaxing write verification is not considered problematic since the exact locations of the cell voltage distributions (CVDs) is less sensitive in a DNN and it is often advantageous to have random bit errors that allow the DNN to avoid overfitting. As noted, this provides for DNN regularization by allowing bit flips in the weights of the network and data samples.

In some examples, a discussed above, there is no ECC encoding before writing the synaptic weights to save power, latency, and space. ECC is disabled for synaptic weights both because the BER is expected to be low due to the short expected storage time and because no ECC can serve as a natural regularization to the weights avoiding overfitting. The write trim may be modified so that it suits the short expected storage time and the minimal external effects that the data should sustain. In particular, the number of verify pulses may be reduced (or write verification is turned off) to reduce the write duration significantly, e.g. by more than 50% of its latency. The read flow of the synaptic weights may be modified also such that there is no ECC decoding, and the read parameters may be set such that the read parameters are calibrated to dynamic buffers (i.e. read thresholds may be set different for the dynamic buffer compared to regular memory). The static data buffer is also modified with parameters that differ from the dynamic data buffer. Allowing BER to increase in the static data buffer also provides a form of data augmentation without applying any operation and saving the resources (less power consumption and latency).

The procedures herein are generally beneficial for other multidimensional computation procedures (e.g. minima or maxima search computations or algorithms besides DNN) that may be implemented in an NVM die, such as stochastic gradient-based optimization algorithms that use an intermediate computation "work-sheet" at the memory level, during which the typical retention duration is very short. The techniques herein thus may allow enhanced acceleration of the read/programming durations for such applications (e.g. expectation-maximization algorithms, regularized regression, and stochastic gradient descents).

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NAND flash memory, such as 3D NAND flash memory or other NVM devices. More generally, semiconductor memory devices include working memory devices, such as DRAM or SRAM devices, NVM devices, ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/ or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "one or more of A, B, and C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" and "one or more of A, B, and C" are intended to cover A, B, C, A-B, A-C, B-C, and A-B-C, as well as multiples of the same members (e.g., any lists that include AA, BB, or CC). Likewise, "at least one of: A, B, and C" and "one or more of A, B, and C" are intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. A memory die, comprising:
   non-volatile memory (NVM) elements; and
   processing circuitry configured to:
   store a first set of data for a multidimensional computation procedure in a first set of the NVM elements using a first set of NVM access parameters selected for use with the first set of data;
   generate a second set of data from the first set of data using the multidimensional computation procedure, wherein the second set of data has a rate of change that is greater than a rate of change of the first set of data; and
   store the second set of data in a second set of the NVM elements using a second set of NVM access parameters selected for use with the second set of data.

2. The memory die of claim 1, wherein the multidimensional computation procedure comprises a neural network backpropagation procedure, the first set of data comprises a first set of neural network data, the second set of data comprises a second set of neural network data, and the processing circuitry is further configured to generate the second set of neural network data from the first set of neural network data using the neural network backpropagation procedure.

3. The memory die of claim 1, wherein the first set of NVM access parameters comprise parameters for controlling read and write access to the first set of NVM elements, and the second set of NVM access parameters comprise parameters for controlling read and write access to the second set of NVM elements, and the processing circuitry is further configured to:
   initialize the first set of NVM elements using the first set of NVM access parameters prior to storing the first set of data in the first set of NVM elements; and
   initialize the second set of NVM elements using the second set of NVM access parameters prior to storing the second set of data in the second set of NVM elements.

4. The memory die of claim 1, wherein the first and second sets of NVM access parameters comprise one or more of: a program voltage setting, a program pulse width, a read threshold, a program threshold, an error correction control parameter, a write verification control parameter, and a read threshold calibration control parameter, and wherein the processing circuitry is further configured to adjust at least one of the first and second sets of NVM access parameters following storage of the first set of data.

5. The memory die of claim 1, wherein initial values of the first and second sets of NVM access parameters are stored in a boot memory of the memory die and wherein the processing circuitry is further configured to read the initial values from the boot memory.

6. The memory die of claim 1, wherein the processing circuitry is further configured to adjust the first set of NVM access parameters to provide longer data retention as compared to a duration of data retention provided using the second set of NVM access parameters.

7. The memory die of claim 1, wherein the processing circuitry is further configured to adjust the second set of NVM access parameters to provide faster write speeds as compared to write speeds provided using the first set of NVM access parameters.

8. The memory die of claim 1, wherein the first and second sets of NVM access parameters comprise error correction control parameters, and wherein the processing circuitry is further configured, by the error correction control parameters, to (a) disable error correction or (b) use fewer error correction bits as compared to a number of error correction bits used by the processing circuitry for storing data not involved in the multidimensional computation procedure.

9. The memory die of claim 1, wherein the first and second sets of NVM access parameters comprise write verification control parameters, and wherein the processing circuitry is further configured, by the write verification control parameters, to perform one or more of (a) provide write verification for the storage of the first set of data, (b) disable write verification for the storage of the second set of data or (c) use fewer write verification pulses for the storage of the second set of data as compared to a number of pulses involved in write verification of the first set of data.

10. The memory die of claim 1, wherein the processing circuitry is further configured to regularize a neural network represented by data stored in the first and second sets of NVM elements by setting one or more of the first and second sets of NVM access parameters to cause at least a threshold number of bit flips within data stored in one or more of the first and second sets of NVM elements.

11. A method for use with a memory die including non-volatile memory (NVM) elements, the method comprising:
   storing a first set of data for a multidimensional computation procedure in a first set of NVM elements using a first set of trim parameters selected for use with the first set of data;
   generating a second set of data from the first set of data using the multidimensional computation procedure, wherein the second set of data has a rate of change that is greater than a rate of change of the first set of data; and storing the second set of data in a second set of NVM elements using a second set of trim parameters selected for use with the second set of data.

12. The method of claim 11, wherein the multidimensional computation procedure comprises a neural network backpropagation procedure, the first set of data comprises a first set of neural network data, and the second set of data comprises a second set of neural network data, and wherein the second set of neural network data has a rate of change within the neural network backpropagation procedure that is greater than a rate of change of the first set of neural network data within the neural network backpropagation procedure.

13. The method of claim 11, wherein the first set of trim parameters comprise trim parameters for configuring read and write access to the first set of NVM elements, and the second set of trim parameters comprise trim parameters for configuring read and write access to the second set of NVM elements.

14. The method of claim 13, wherein the first and second sets of data trim parameters include one or more of: a program voltage setting, a program pulse width, a read threshold, a program threshold, an error correction control parameter, a write verification control parameter, and a read threshold calibration control parameter.

15. The method of claim 11, further comprising adjusting the first set of trim parameters to provide greater data retention as compared to a level of data retention provided using the second set of trim parameters.

16. The method of claim 11, further comprising adjusting the second set of trim parameters to provide greater write performance as compared to a level of write performance provided using the first set of trim parameters.

17. The method of claim 11, wherein the first and second sets of trim parameters include parameters for controlling read threshold calibration and wherein a frequency of read threshold calibration is set differently for the first and second sets of NVM elements.

18. The method of claim 11, further comprising setting one or more of the first and second sets of trim parameters to provide a selected bit error rate (BER) within data stored in one or more of the first and second sets of NVM elements.

19. The method of claim 11, further comprising storing user data in a third set of NVM elements using a third set of trim parameters, wherein the first, second, and third sets of NVM access parameters are different from one another.

20. The method of claim 11, wherein the first and second sets of NVM access parameters are different from one another.

21. The method of claim 11, wherein the first set of data comprises static data that does not change during the multidimensional computation procedure and the second set of data comprises dynamic data that changes during the multidimensional computation procedure.

22. The method of claim 11, wherein the first set of data comprises data that changes slower than a first threshold rate during the multidimensional computation procedure and the second set of data comprises data that changes faster than a second threshold rate during the multidimensional computation procedure.

\* \* \* \* \*